United States Patent
Yamazaki

(10) Patent No.: US 9,246,047 B2
(45) Date of Patent: Jan. 26, 2016

(54) SEMICONDUCTOR DEVICE

(71) Applicant: SEMICONDUCTOR ENERGY LABORATORY CO., LTD., Atsugi-shi, Kanagawa-ken (JP)

(72) Inventor: Shunpei Yamazaki, Tokyo (JP)

(73) Assignee: Semiconductor Energy Laboratory Co., LTD., Kanagawa-ken (JP)

( * ) Notice: Subject to any disclaimer, the term of this patent is extended or adjusted under 35 U.S.C. 154(b) by 58 days.

(21) Appl. No.: 13/959,768

(22) Filed: Aug. 6, 2013

(65) Prior Publication Data
US 2014/0042432 A1 Feb. 13, 2014

(30) Foreign Application Priority Data

Aug. 10, 2012 (JP) ................................. 2012-178909
Mar. 13, 2013 (JP) ................................. 2013-049973

(51) Int. Cl.
*H01L 29/10* (2006.01)
*H01L 21/00* (2006.01)
(Continued)

(52) U.S. Cl.
CPC ........ *H01L 33/0041* (2013.01); *H01L 27/1225* (2013.01); *H01L 27/1255* (2013.01); *H01L 2924/0002* (2013.01)

(58) Field of Classification Search
CPC ............ H01L 27/1214; H01L 27/1251; H01L 27/3248; H01L 27/3251; H01L 27/3258; H01L 27/3274; H01L 29/4908; H01L 51/0508; H01L 2021/775; H01L 2924/13069
USPC ............... 257/13, 79–103, 918, 40, 642–643, 257/759; 438/22–47, 69, 493, 503, 507, 438/956
See application file for complete search history.

(56) References Cited

U.S. PATENT DOCUMENTS

| 4,829,358 A | 5/1989 | Yamazaki |
| 5,182,661 A | 1/1993 | Ikeda et al. |

(Continued)

FOREIGN PATENT DOCUMENTS

| EP | 1 737 044 A1 | 12/2006 |
| EP | 2 226 847 A2 | 9/2010 |

(Continued)

OTHER PUBLICATIONS

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

(Continued)

*Primary Examiner* — Robert Bachner
*Assistant Examiner* — Moin Rahman
(74) *Attorney, Agent, or Firm* — Nixon Peabody LLP; Jeffrey L Costellia

(57) ABSTRACT

A semiconductor device in which charge capacity of a capacitor is increased without a reduction in aperture ratio is provided. In a transistor including a light-transmitting semiconductor film and a capacitor in which a dielectric film is provided between a pair of electrodes, the pair of electrodes and the dielectric film are formed using a light-transmitting material. A semiconductor film which is formed on the same surface as the semiconductor film of the transistor is used as one of the pair of electrodes. The dielectric film included in the capacitor is formed using a gate insulating film. The other of the pair of electrodes is formed using a light-transmitting semiconductor film or a light-transmitting conductive film.

26 Claims, 17 Drawing Sheets

(51) Int. Cl.
*H01L 33/00* (2010.01)
*H01L 27/12* (2006.01)

(56) References Cited

U.S. PATENT DOCUMENTS

| | | |
|---|---|---|
| 5,289,174 A | 2/1994 | Suzuki |
| 5,321,535 A | 6/1994 | Ukai et al. |
| 5,365,079 A | 11/1994 | Kodaira et al. |
| 5,418,636 A | 5/1995 | Kawasaki |
| 5,483,366 A | 1/1996 | Atherton |
| 5,517,342 A | 5/1996 | Kim et al. |
| 5,731,856 A | 3/1998 | Kim et al. |
| 5,744,864 A | 4/1998 | Cillessen et al. |
| 5,745,195 A | 4/1998 | Zhang |
| 6,108,065 A | 8/2000 | Ota et al. |
| 6,160,600 A | 12/2000 | Yamazaki et al. |
| 6,281,953 B1 | 8/2001 | Lee et al. |
| 6,294,274 B1 | 9/2001 | Kawazoe et al. |
| 6,411,357 B1 | 6/2002 | Ting et al. |
| 6,462,800 B1 | 10/2002 | Kim et al. |
| 6,563,174 B2 | 5/2003 | Kawasaki et al. |
| 6,600,535 B1 | 7/2003 | Tsuda et al. |
| 6,727,522 B1 | 4/2004 | Kawasaki et al. |
| 6,933,528 B2 | 8/2005 | Itakura et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,106,400 B1 | 9/2006 | Tsuda et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,382,421 B2 | 6/2008 | Hoffman et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,605,898 B2 | 10/2009 | Ochiai et al. |
| 7,674,650 B2 | 3/2010 | Akimoto et al. |
| 7,714,975 B1 | 5/2010 | Yamazaki et al. |
| 7,732,819 B2 | 6/2010 | Akimoto et al. |
| 8,102,476 B2 | 1/2012 | Son et al. |
| 8,729,547 B2 | 5/2014 | Miyairi et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2002/0140891 A1 | 10/2002 | Tomioka et al. |
| 2003/0038241 A1* | 2/2003 | Choo et al. ............... 250/370.09 |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0051100 A1 | 3/2004 | Yamazaki et al. |
| 2004/0127038 A1 | 7/2004 | Carcia et al. |
| 2004/0183978 A1 | 9/2004 | Jeoung |
| 2005/0007507 A1 | 1/2005 | Ono et al. |
| 2005/0017302 A1 | 1/2005 | Hoffman |
| 2005/0046763 A1 | 3/2005 | Ono et al. |
| 2005/0199959 A1 | 9/2005 | Chiang et al. |
| 2005/0231673 A1 | 10/2005 | Yamazaki et al. |
| 2006/0001817 A1 | 1/2006 | Yamazaki et al. |
| 2006/0035452 A1 | 2/2006 | Carcia et al. |
| 2006/0043377 A1 | 3/2006 | Hoffman et al. |
| 2006/0055859 A1 | 3/2006 | Jin et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0013820 A1 | 1/2007 | Jeoung |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0164939 A1* | 7/2007 | Miyazaki ................... 345/76 |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0236640 A1 | 10/2007 | Kimura |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0163874 A1 | 7/2010 | Koyama et al. |
| 2011/0031491 A1* | 2/2011 | Yamazaki et al. ............... 257/43 |
| 2012/0038618 A1* | 2/2012 | Koyama ................... 345/212 |
| 2014/0034954 A1 | 2/2014 | Yamazaki et al. |

FOREIGN PATENT DOCUMENTS

| | | |
|---|---|---|
| JP | 60-198861 | 10/1985 |
| JP | 63-210022 | 8/1988 |
| JP | 63-210023 | 8/1988 |
| JP | 63-210024 | 8/1988 |
| JP | 63-215519 | 9/1988 |
| JP | 63-239117 | 10/1988 |
| JP | 63-265818 | 11/1988 |
| JP | 05-251705 | 9/1993 |
| JP | 07-104312 | 4/1995 |
| JP | 08-264794 | 10/1996 |
| JP | 11-505377 | 5/1999 |
| JP | 2000-044236 | 2/2000 |
| JP | 2000-150900 | 5/2000 |
| JP | 2002-076356 | 3/2002 |

(56) References Cited

FOREIGN PATENT DOCUMENTS

| JP | 2002-289859 | 10/2002 |
|---|---|---|
| JP | 2003-086000 | 3/2003 |
| JP | 2003-086808 | 3/2003 |
| JP | 2004-103957 | 4/2004 |
| JP | 2004-273614 | 9/2004 |
| JP | 2004-273732 | 9/2004 |
| JP | 2005-077822 | 3/2005 |
| JP | 2007-096055 | 4/2007 |
| JP | 2007-123861 | 5/2007 |
| WO | WO-2004/114391 A1 | 12/2004 |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters) , Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs,". SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters) , Jun. 17, 1996; vol. 68, No. 25. pp. 3650-3652.

Nakamura.M et al., "The phase relations in the $In_2O_3$—$Ga_2ZnO_4$—ZnO system at 1350° C.,", Journal of Solid State Chemistry, Aug. 1, 1991, vol. 93, No. 2, pp. 298-315.

Kimizuka.N et al., "Syntheses and Single-Crystal Data of Homologous Compounds, $In_2O_3(ZnO)m$ (m=3, 4, and 5), $InGaO_3(ZnO)_3$, and $Ga_2O_3(ZnO)m$ (m=7, 8, 9, and 16) in the $In_2O_3$—$ZnGa_2O_4$—ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics) , Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline $InGaO_3(ZnO)_5$ films,", Appl. Phys. Lett. (Applied Physics Letters) , Sep. 13, 2004, vol. 85, No. 11, pp. 1993-1995.

Li.C et al., "Modulated Structures of Homologous Compounds $InMO_3(ZnO)m$ (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous Gizo ($Ga_2O_3$—$In_2O_3$—ZnO) TFT,", SID Digest '08 : SID International Symposium Digest of Technical Papers, May 20, 2008, vol. 39, pp. 633-636.

Lee.J et al., "World's Largest (15-Inch) XGA ANLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing $MoO_3$ as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium—Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTs,", IDW '09 : Proceedings of the 16th International Display Workshops, 2009, pp. 689-692.

Park.J et al., "Amorphous Indium—Gallium—Zinc Oxide TFTs and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by Peald Grown ZnO TFT,", IMID '07 Digest, 2007, pp. 1249-1252.

Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.

Osada.T et al., "Development of Driver-Integrated Panel Using Amorphous In—Ga—Zn—Oxide TFT,", AM-FPD '09 Digest of Technical Papers, Jul. 1, 2009, pp. 33-36.

(56) References Cited

OTHER PUBLICATIONS

Hirao.T et al., "Novel Top-Gate Zinc Oxide Thin-Film Transistors (ZnO TFTs) for AMLCDS,", Journal of the SID, 2007, vol. 15, No. 1, pp. 17-22.
Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.
Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.
Ohara.H et al., "21.3:4.0 In. QVGA AMOLED Display Using In—Ga—Zn—Oxide TFTs With a Novel Passivation Layer,", SID Digest '09 : SID International Symposium Digest of Technical Papers, May 31, 2009, pp. 284-287.
Miyasaka.M, "Suftla Flexible Microelectronics on Their Way to Business,", SID Digest '07.: SID International Symposium Digest of Technical Papers, 2007, vol. 38, pp. 1673-1676.
Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.
Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.
Asaoka,Y et al.. "29.1:Polarizer-Free Reflective LCD Combined With Ultra Low-Power Driving Technology,", SID Digest '09 : SID International Symposium Digest of Technical Papers, May 31, 2009, pp. 395-398.
Lee.H et al., "Current Status of, Challenges to, and Perspective View of AM-OLED ,", IDW '06 : Proceedings of the 13th International Display Workshops, Dec. 7, 2006, pp. 663-666.
Kikuchi.H et al., "62.2:Invited Paper:Fast Electro-Optical Switching in Polymer-Stabilized Liquid Crystalline Blue Phases for Display Application,", SID Digest '07 : SID.International Symposium Digest of Technical Papers, 2007, vol. 38, pp. 1737-1740.
Nakamura.M, "Synthesis of Homologous Compound with New Long-Period Structure,", NIRIM Newsletter, Mar. 1, 1995, vol. 150, pp. 1-4.
Kikuchi.H et al., "Polymer-Stabilized Liquid Crystal Blue Phases,", Nature Materials, Sep. 2, 2002, vol. 1, pp. 64-68.
Kimizuka.N et al., "Spinel,YbFe2O4, andYb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.,", Journal of Solid State Chemistry, 1985, vol. 60, pp. 382-384.
Kitzerow.H et al., "Observation of Blue Phases in Chiral Networks,", Liquid Crystals, 1993, vol. 14, No. 3, pp. 911-916.
Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.
Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.
Orita.M et al., "Mechanism of Electrical Conductivity of Transparent InGaZnO4,", Phys. Rev. B (Physical Review. B), Jan. 15, 2000, vol. 61, No. 3, pp. 1811-1816.
Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.
Janotti.A et al., "Native Point Defects in ZnO,", Phys. Rev. B (Physical Review. B), Oct. 4, 2007, vol. 76, No. 16, pp. 165202-1-165202-22.
Park.J et al., "Electronic Transport Properties of Amorphous Indium—Gallium—Zinc Oxide Semiconductor Upon Exposure to Water,", Appl. Phys. Lett. (Applied Physics Letters) , 2008, vol. 92, pp. 072104-1-072104-3.
Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.
Janotti.A et al., "Oxygen Vacancies in ZnO,", Appl. Phys. Lett. (Applied Physics Letters) , 2005, vol. 87, pp. 122102-1-122102-3.
Oba.F et al., "Defect energetics in ZnO: A hybrid Hartree-Fock density functional study,", Phys. Rev. B.(Physical Review. B), 2008, vol. 77, pp. 245202-1-245202-6.
Orita.M et al "Amorphous transparent conductive oxide InGaO3(ZnO)m (m<4):a Zn4s conductor,", Philosophical Magazine, 2001, vol. 81, No. 5, pp. 501-515.
Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.
Mo.Y et al., "Amorphous Oxide TFT Backplanes for Large Size AMOLED Displays,", IDW '08 : Proceedings of the 6th International Display Workshops, Dec. 3, 2008, pp. 581-584.
Kim.S et al., "High-Performance oxide thin film transistors passivated by various gas plasmas,", 214th ECS Meeting, 2008, No. 2317, ECS.
Clark.S et al., "First Principles Methods Using CASTEP,", Zeitschrift fur Kristallographie, 2005, vol. 220, pp. 567-570.
Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.
Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.
Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.
Ueno.K et al., "Field-Effect Transistor on SrTiO3 With Sputtered Al2O3 Gate Insulator,", Appl. Phys. Lett. (Applied Physics Letters), Sep. 1, 2003, vol. 83, No. 9, pp. 1755-1757.

* cited by examiner

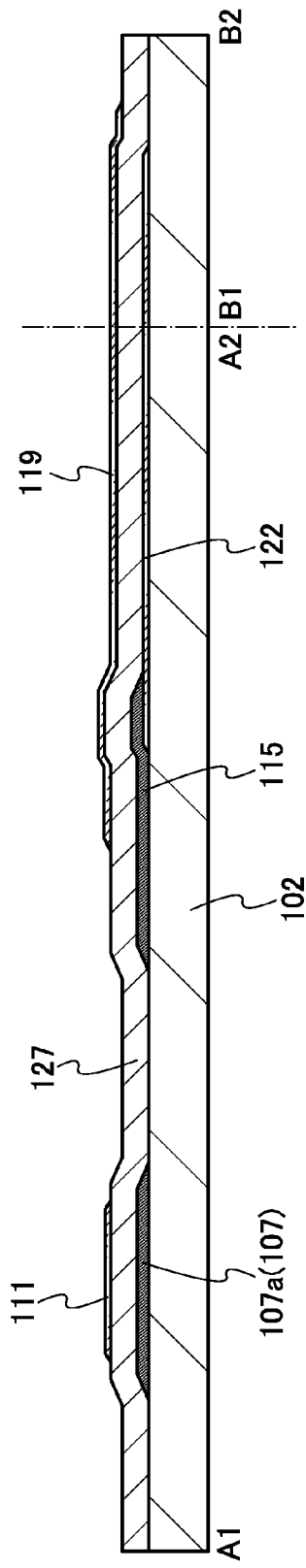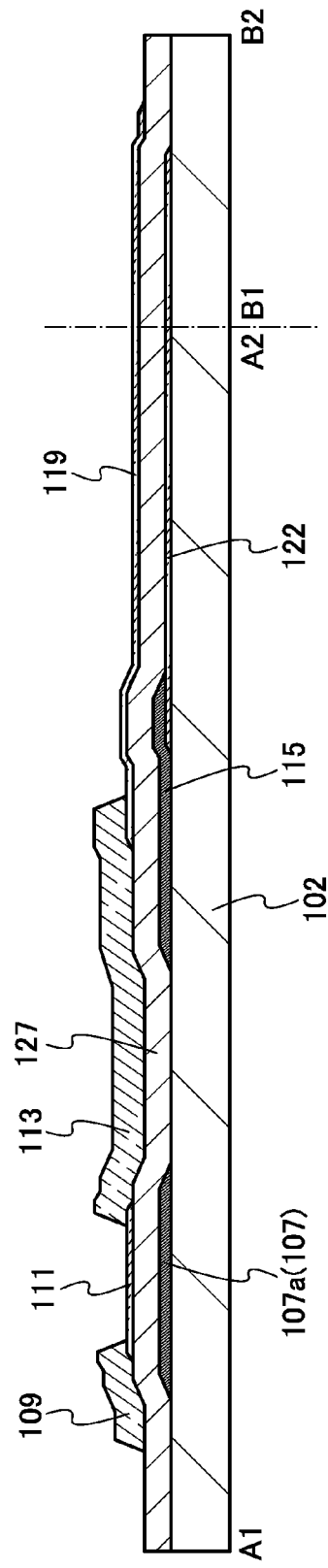

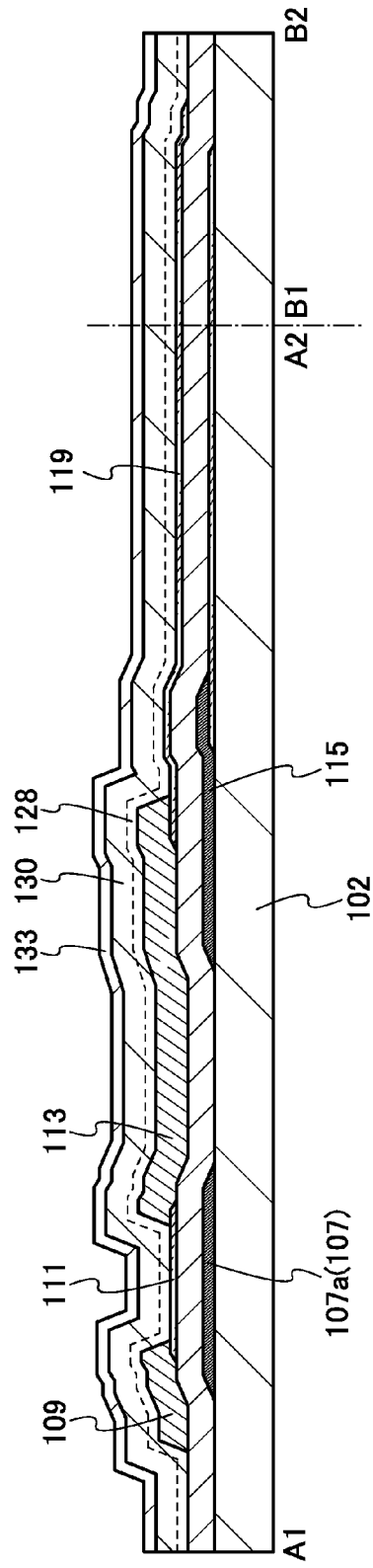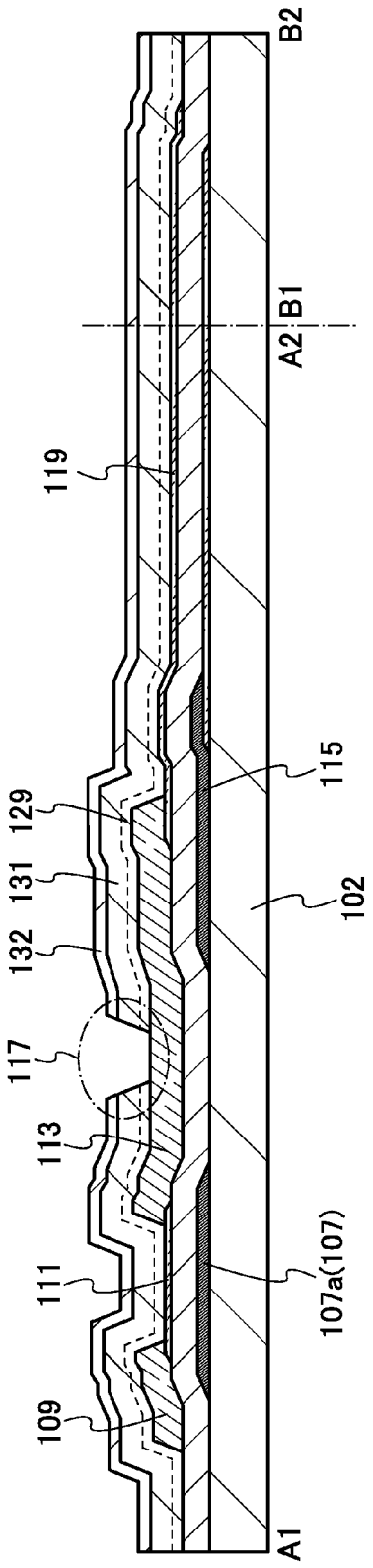

SEMICONDUCTOR DEVICE

BACKGROUND OF THE INVENTION

1. Field of the Invention

The invention disclosed in this specification and the like relates to semiconductor devices.

In this specification, a semiconductor device means all types of devices that can function by utilizing semiconductor characteristics, and a transistor, a semiconductor circuit, a memory device, an imaging device, a display device, an electro-optical device, an electronic device, and the like are all semiconductor devices.

2. Description of the Related Art

In recent years, flat panel displays such as liquid crystal displays (LCDs) have been widespread. In each of pixels provided in the row direction and the column direction in a display device such as a flat panel display, a transistor serving as a switching element, a liquid crystal element electrically connected to the transistor, and a capacitor connected to the liquid crystal element in parallel are provided.

As a semiconductor material for forming a semiconductor film of the transistor, a silicon semiconductor such as amorphous silicon or polysilicon (polycrystalline silicon) is generally used.

Metal oxides having semiconductor characteristics (hereinafter referred to as oxide semiconductors) can be used for semiconductor films in transistors. For example, techniques for forming transistors using zinc oxide or an In—Ga—Zn-based oxide semiconductor are disclosed (see Patent Documents 1 and 2).

REFERENCE

Patent Document

[Patent Document 1] Japanese Published Patent Application No. 2007-123861
[Patent Document 2] Japanese Published Patent Application No. 2007-096055

SUMMARY OF THE INVENTION

In a capacitor, a dielectric film is provided between a pair of electrodes at least one of which is formed, in many cases, using a light-blocking film partly serving as a gate electrode, a source electrode, a drain electrode, or the like of a transistor.

As the capacitance of a capacitor is increased, a period in which the alignment of liquid crystal molecules of a liquid crystal element can be kept constant in the state where an electric field is applied can be made longer. When the period can be made longer in a display device which displays a still image, the number of times of rewriting image data can be reduced, leading to a reduction in power consumption.

One of methods for increasing the charge capacity of a capacitor is to increase the area occupied by the capacitor, specifically, to increase the area of a portion where a pair of electrodes overlap with each other. However, when the area of a light-blocking conductive film is increased in order to increase the area of a portion where a pair of electrodes overlap with each other, the aperture ratio of a pixel is lowered and thus display quality of an image is degraded.

In view of the above problem, it is an object of one embodiment of the present invention to provide a semiconductor device including a capacitor with increased charge capacity and having a high aperture ratio.

One embodiment of the present invention is a semiconductor device including a transistor and a light-transmitting capacitor. Specifically, a pair of electrodes and a dielectric film which form the capacitor are formed using light-transmitting materials. At least one of the pair of electrodes is formed using a light-transmitting semiconductor film. The other of the pair of electrodes is formed using a light-transmitting conductive film or a light-transmitting semiconductor film.

The light-transmitting semiconductor film can be formed using an oxide semiconductor. This is because an oxide semiconductor has an energy gap as wide as 3.0 eV or more and thus has high visible-light transmissivity.

The light-transmitting capacitor can be formed using a material and a formation process of the transistor. For example, one electrode of the capacitor can be formed using a formation process of a semiconductor film of the transistor, and the dielectric film of the capacitor can be formed using a formation process of a gate insulating film of the transistor.

In the case where part of a semiconductor film which is formed in the process for forming the semiconductor film of the transistor is made to function as the electrode of the capacitor, the conductivity of the semiconductor film is preferably increased. For example, it is preferable to add one or more selected from boron, nitrogen, fluorine, aluminum, phosphorus, arsenic, indium, tin, antimony, and a rare gas element to the semiconductor film. An ion implantation method, an ion doping method, or the like may be employed to add the element to the semiconductor film. Alternatively, the semiconductor film may be exposed to plasma containing the element so that the element can be added.

In the case where an oxide semiconductor film functions as the electrode of the capacitor, a nitride insulating film may be provided in contact with the oxide semiconductor film. When the nitride insulating film is in contact with the oxide semiconductor film, defect states (interface states) at the interface between the nitride insulating film and the oxide semiconductor film or diffusion of nitrogen contained in the nitride insulating film into the oxide semiconductor film leads to an increase in the conductivity of the oxide semiconductor film.

When the nitride insulating film is in contact with the semiconductor film in the capacitor as described above, a step of adding an element which increases the conductivity to the semiconductor film by an ion implantation method, an ion doping method, or the like can be skipped; therefore, the yield of the semiconductor device can be improved and the manufacturing cost thereof can be reduced.

In the case where a semiconductor film functions as the electrode of the capacitor, the conductivity of the semiconductor film is set to higher than or equal to 10 S/cm and lower than or equal to 1000 S/cm, preferably higher than or equal to 100 S/cm and lower than or equal to 1000 S/cm.

With the above structure, the capacitor transmits light and thus can be formed large (in a large area) in a region except a portion where the transistor in a pixel is formed. For this reason, the semiconductor device can have charge capacity increased while the aperture ratio is improved. As a result, the semiconductor device can have an excellent display quality.

In the capacitor, the dielectric film is formed using an insulating film included in the transistor; therefore, the dielectric film can have the same stacked-layer structure as the insulating film. For example, in the case where an insulating film provided over a gate electrode of the transistor has a stacked-layer structure of a nitride insulating film and an oxide insulating film, the dielectric film of the capacitor can have a stacked-layer structure of the nitride insulating film and the oxide insulating film.

In the case where the semiconductor film of the transistor is an oxide semiconductor film and the insulating film over the gate electrode is a stack of a nitride insulating film and an oxide insulating film, the oxide insulating film is preferably less likely to transmit nitrogen, that is, the oxide insulating film preferably has a barrier property against nitrogen.

With the above structure, one of or both nitrogen and hydrogen can be prevented from diffusing into the oxide semiconductor film as the semiconductor film of the transistor, so that variations in the electrical characteristics of the transistor can be suppressed.

In the above semiconductor device of one embodiment of the present invention, a scan line which is electrically connected to the gate electrode of the transistor and a capacitor line which is over the same surface as the scan line and extends in a direction parallel to the scan line are provided. One electrode of the capacitor is electrically connected to the transistor through a conductive film which can be formed when a source electrode or a drain electrode of the transistor is formed.

The other electrode of the capacitor is electrically connected to the capacitor line. The capacitor line connected to the other electrode of the capacitor can be provided partly in contact with the electrode along the outer periphery thereof. In this manner, contact resistance between the electrode and the capacitor line can be reduced, so that charge can be efficiently supplied to the capacitor.

One embodiment of the present invention is a semiconductor device which includes a transistor including a light-transmitting semiconductor film in a channel formation region and a capacitor including a dielectric film between a first electrode and a second electrode. In the capacitor, the first electrode, the second electrode, and the dielectric film are each formed with a light-transmitting material. A semiconductor film formed on the same surface as the light-transmitting semiconductor film of the transistor functions as the first electrode. The second electrode is formed below a gate insulating film of the transistor. A region of the gate insulating film which overlaps with the first electrode and the second electrode is used as the dielectric film.

One embodiment of the present invention is a semiconductor device which includes a transistor including a light-transmitting semiconductor film in a channel formation region and a capacitor including a dielectric film between a first electrode and a second electrode. In the capacitor, the first electrode, the second electrode, and the dielectric film are each formed with a light-transmitting material. A semiconductor film formed on the same surface as the light-transmitting semiconductor film of the transistor functions as the first electrode. The dielectric film has a stacked-layer structure of a nitride insulating film and an oxide insulating film. The second electrode is formed in contact with the nitride insulating film.

The first electrode includes a region having a higher conductivity than the channel formation region of the light-transmitting semiconductor film of the transistor. The first electrode is electrically connected to a pixel electrode. A potential of the second electrode is higher than a potential of the pixel electrode.

Note that a fabrication method of a semiconductor device of one embodiment of the present invention is also one embodiment of the present invention.

According to one embodiment of the present invention, a semiconductor device including a capacitor whose charge capacity is increased while the aperture ratio is improved can be provided.

BRIEF DESCRIPTION OF THE DRAWINGS

FIGS. 4A and 4B are cross-sectional views illustrating a fabrication method of a semiconductor device of one embodiment of the present invention.

FIGS. 5A and 5B are cross-sectional views illustrating a fabrication method of a semiconductor device of one embodiment of the present invention.

DETAILED DESCRIPTION OF THE INVENTION

Figure 1A:
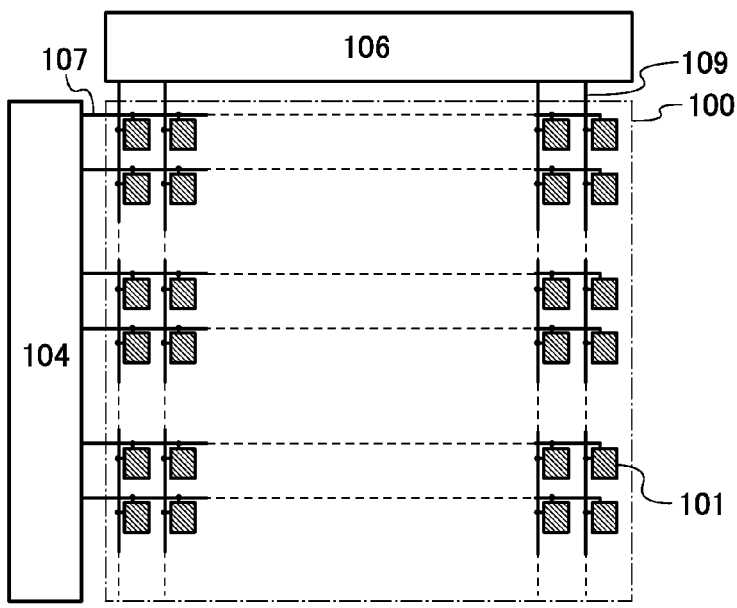
FIG. 1A illustrates a semiconductor device of one embodiment of the present invention and FIGS. 1B and 1C are circuit diagrams each illustrating a pixel.

Hereinafter, embodiments of the present invention will be described in detail with reference to the accompanying drawings. However, the present invention is not limited to the description below, and it is easily understood by those skilled in the art that modes and details disclosed herein can be modified in various ways. In addition, the present invention is not construed as being limited to description of the embodiments.

Note that in structures of the present invention described below, the same portions or portions having similar functions are denoted by the same reference numerals in different drawings, and description thereof is not repeated. Further, the same hatching pattern is applied to portions having similar functions, and the portions are not especially denoted by reference numerals in some cases.

Note that in each drawing described in this specification, the size, the film thickness, or the region of each component is exaggerated for clarity in some cases. Therefore, embodiments of the present invention are not limited to such scales.

Note that ordinal numbers such as "first" and "second" in this specification and the like are used for convenience and do not denote the order of steps or the stacking order of layers. In addition, the ordinal numbers in this specification and the like do not denote particular names which specify the invention.

Functions of a "source" and a "drain" in the present invention are sometimes replaced with each other when the direction of current flow is changed in circuit operation, for example. Therefore, the terms "source" and "drain" can be used to denote the drain and the source, respectively, in this specification.

Note that a voltage refers to a difference between potentials of two points, and a potential refers to electrostatic energy (electric potential energy) of a unit charge at a given point in an electrostatic field. In general, a difference between a potential of one point and a reference potential (e.g., a ground potential) is merely called a potential or a voltage, and a potential and a voltage are used in many cases as synonymous words. Thus, in this specification, a potential may be rephrased as a voltage and a voltage may be rephrased as a potential unless otherwise specified.

In this specification, a term "parallel" indicates that the angle formed between two straight lines is greater than or equal to −10° and less than or equal to 10°, and accordingly includes the case where the angle is greater than or equal to −5° and less than or equal to 5°. In addition, a term "perpendicular" indicates that the angle formed between two straight lines is greater than or equal to 80° and less than or equal to 100°, and accordingly includes the case where the angle is greater than or equal to 85° and less than or equal to 95°.

Embodiment 1

In this embodiment, a semiconductor device of one embodiment of the present invention will be described with reference to drawings. Note that in this embodiment, a semiconductor device of one embodiment of the present invention is described taking a liquid crystal display device as an example.

<Structure of Semiconductor Device>

FIG. 1A illustrates an example of a structure of a semiconductor device. The semiconductor device in FIG. 1A includes a pixel portion 100, a scan line driver circuit 104, a signal line driver circuit 106, m scan lines 107 which are arranged in parallel or substantially in parallel and whose potentials are controlled by the scan line driver circuit 104, and n signal lines 109 which are arranged in parallel or substantially in parallel and whose potentials are controlled by the signal line driver circuit 106. Further, the pixel portion 100 includes a plurality of pixels 101 arranged in a matrix. Furthermore, capacitor lines 115 (not illustrated in FIG. 1A) arranged in parallel or substantially in parallel are provided along the scan lines 107. Note that the capacitor lines 115 may be arranged in parallel or substantially in parallel along the signal lines 109.

Each scan line 107 is electrically connected to the n pixels 101 in the corresponding row among the pixels 101 arranged in m rows and n columns in the pixel portion 100. Each signal line 109 is electrically connected to the m pixels 101 in the corresponding column among the pixels 101 arranged in m rows and n columns. Note that m and n are each an integer of 1 or more. Each capacitor line 115 is electrically connected to the n pixels 101 in the corresponding row among the pixels 101 arranged in m rows and n columns. Note that in the case where the capacitor lines 115 are arranged in parallel or substantially in parallel along the signal lines 109, each capacitor line 115 is electrically connected to the m pixels 101 in the corresponding column among the pixels 101 arranged in m rows and n columns.

Figure 1B:
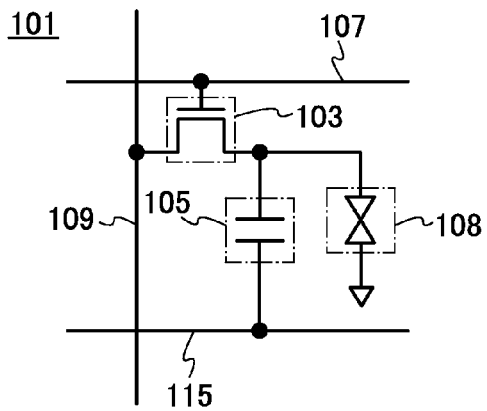

FIG. 1B is an example of a circuit diagram of the pixel 101 included in the semiconductor device illustrated in FIG. 1A. The pixel 101 in FIG. 1B includes a transistor 103 a gate electrode of which is electrically connected to the scan line 107 and a source electrode of which is electrically connected to the signal line 109, a capacitor 105 one electrode of which is electrically connected to a drain electrode of the transistor 103 and the other electrode of which is electrically connected to the capacitor line 115 which supplies a constant potential, and a liquid crystal element 108. A pixel electrode of the liquid crystal element 108 is electrically connected to the drain electrode of the transistor 103 and one electrode of the capacitor 105, and an electrode (counter electrode) facing the pixel electrode is electrically connected to a wiring which supplies a common potential.

Figure 1C:
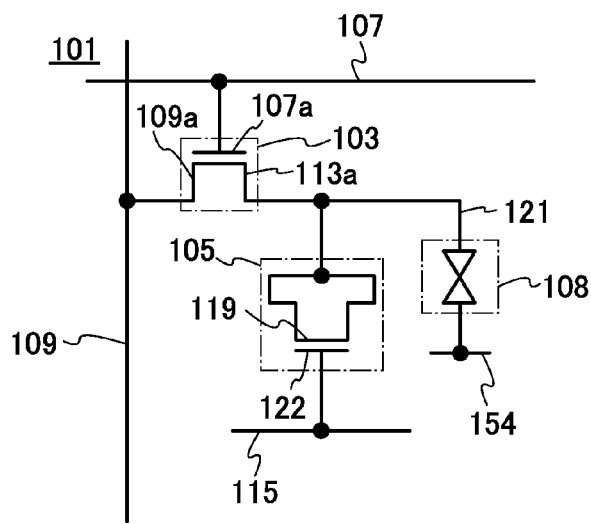

As well as FIG. 1B, FIG. 1C shows a circuit diagram of the pixel 101 included in the semiconductor device illustrated in FIG. 1A.

The liquid crystal element 108 is an element which controls transmission of light by an optical modulation action of liquid crystal which is sandwiched between a substrate provided with the transistor 103 and the pixel electrode and a substrate provided with the counter electrode. The optical modulation action of liquid crystal is controlled by an electric field applied to the liquid crystal (including a horizontal electric field, a vertical electric field, and a diagonal electric field).

Figure 2:
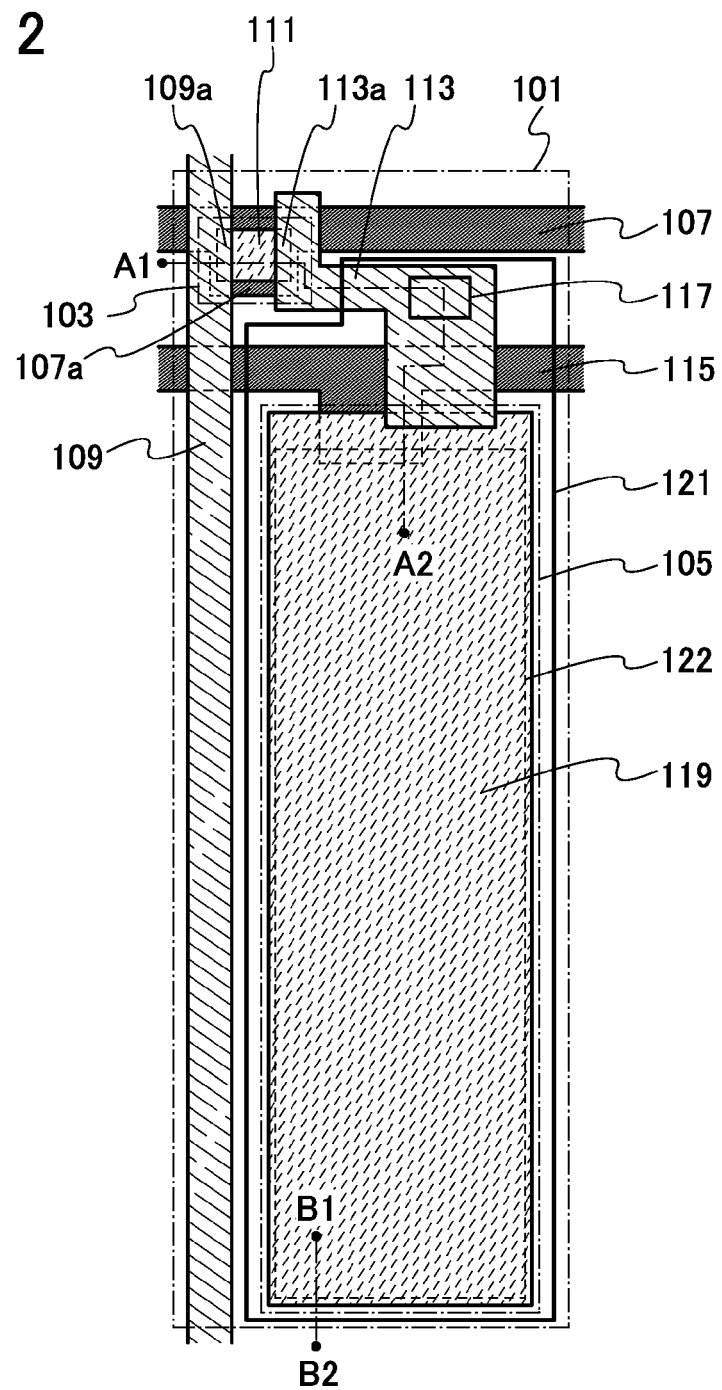
FIG. 2 is a top view illustrating a semiconductor device of one embodiment of the present invention.

Next, a specific example of a structure of the pixel 101 of the liquid crystal display device will be described. FIG. 2 is a top view of the pixel 101. Note that some components such as a counter electrode and a liquid crystal element are omitted in FIG. 2.

In FIG. 2, the scan line 107 is provided so as to extend in the direction perpendicular or substantially perpendicular to the signal line 109 (in the horizontal direction in the drawing). The signal line 109 is provided so as to extend in the direction perpendicular or substantially perpendicular to the scan line 107 (in the vertical direction in the drawing). The capacitor line 115 is provided so as to extend in the direction parallel to the scan line 107. The scan line 107 and the capacitor line 115 are electrically connected to the scan line driver circuit 104 (see FIG. 1A), and the signal line 109 is electrically connected to the signal line driver circuit 106 (see FIG. 1A).

The transistor 103 is provided in a region where the scan line 107 and the signal line 109 cross each other. The transistor 103 includes at least a semiconductor film 111 including a channel formation region, a gate electrode, a gate insulating film (not illustrated in FIG. 2), a source electrode, and a drain electrode. A portion of the scan line 107 which overlaps with the semiconductor film 111 functions as the gate electrode of the transistor 103. A portion of the signal line 109 which overlaps with the semiconductor film 111 functions as the source electrode of the transistor 103. A portion of a conductive film 113 which overlaps with the semiconductor film 111 functions as the drain electrode of the transistor 103. Thus, the gate electrode, the source electrode, and the drain electrode may be referred to as the scan line 107, the signal line 109, and the conductive film 113, respectively. Further, an edge of the scan line 107 is on the outer side than an edge of the semiconductor film when seen from above. Thus, the scan line 107 functions as a light-blocking film for blocking light from a backlight. For this reason, the semiconductor film 111 included in the transistor is not irradiated with light, so that variations in the electrical characteristics of the transistor can be suppressed.

Further, an oxide semiconductor processed under appropriate conditions can significantly reduce the off-state current of a transistor; therefore, such an oxide semiconductor is used for the semiconductor film 111 in one embodiment of the present invention. Thus, power consumption of a semiconductor device can be reduced.

In this embodiment, the scan line 107 includes a gate electrode 107a of the transistor 103, the signal line 109 includes a source electrode 109a of the transistor 103, and the conductive film 113 includes a drain electrode 113a of the transistor 103. The conductive film 113 is electrically connected to a pixel electrode 121 through an opening 117. In FIG. 2, the hatch pattern of the pixel electrode 121 is not illustrated. Further, in some cases, the term "scan line 107" is used also to denote the gate electrode of the transistor and the term "signal line 109" is used also to denote the source electrode of the transistor in the following description.

The capacitor 105 is provided in a region which is in the pixel 101 and surrounded by the capacitor lines 115 and the signal lines 109. The capacitor 105 is electrically connected to the capacitor line 115. The capacitor 105 includes an electrode 122 formed using a light-transmitting conductive material, a light-transmitting semiconductor film 119, and part of a layer used for forming a gate insulating film 127 of the transistor 103 (not illustrated in FIG. 2) sandwiched therebetween. That is, the capacitor 105 transmits light.

Owing to the light-transmitting properties of the electrode 122 and the semiconductor film 119, the capacitor 105 can be formed large (in a large area) in the pixel 101. For this reason, the semiconductor device can have charge capacity increased while the aperture ratio is improved. In general, a non-light-transmitting capacitor blocks light from a backlight or the like, which causes a decrease in aperture ratio. In particular, in a semiconductor device with a high resolution, for example, a liquid crystal display device with a high resolution, the area occupied by one pixel is small and thus it is difficult to ensure enough charge capacity and improve aperture ratio at the same time. However, since the capacitor 105 of this embodiment transmits light, it can be provided in the aperture of a pixel; thus, enough charge capacity can be obtained in each pixel and the aperture ratio can be improved. Typically, the capacitor 105 can be favorably used in a high-resolution semiconductor device with a pixel density of 200 ppi or more, or furthermore, 300 ppi or more. Further, according to one embodiment of the present invention, the aperture ratio can be improved even in a display device with a high resolution, which makes it possible to use efficiently light from a light source device such as a backlight, so that power consumption of the display device can be reduced.

Since the capacitor 105 of this embodiment transmits light, the capacitor can be formed large in the pixel. Thus, it is possible to ensure enough charge capacity while improving the aperture ratio. As a result, the semiconductor device can have an excellent display quality. An oxide semiconductor can be used for the light-transmitting semiconductor film 119, for example.

Next, the characteristics of a transistor including an oxide semiconductor are described. The transistor including an oxide semiconductor is an n-channel transistor. Oxygen vacancies in an oxide semiconductor might generate carriers, which might lower the electrical characteristics and the reliability of the transistor. For example, in some cases, the threshold voltage of the transistor is shifted in the negative direction, and drain current flows when the gate voltage is 0 V. A transistor in which drain current flows when the gate voltage is 0 V is referred to as a normally-on transistor, whereas a transistor in which substantially no drain current flows when the gate voltage is 0 V is referred to as a normally-off transistor.

In view of the above, it is preferable that defects in an oxide semiconductor film as the semiconductor film 111, typically, oxygen vacancies be reduced as much as possible when an oxide semiconductor is used for the semiconductor film 111. For example, it is preferable that the spin density of the oxide semiconductor film (the density of defects in the oxide semiconductor film) at a g-value of 1.93 in electron spin resonance spectroscopy in which a magnetic field is applied in parallel to the film surface be reduced to lower than or equal to the lower detection limit of measurement equipment. When the defects typified by oxygen vacancies in the oxide semiconductor film are reduced as much as possible, the transistor 103 can be prevented from being normally on, leading to improvements in the electrical characteristics and reliability of a semiconductor device.

The shift of the threshold voltage of a transistor in the negative direction is caused in some cases by hydrogen (including a hydrogen compound such as water) contained in an oxide semiconductor as well as by oxygen vacancies. Hydrogen contained in the oxide semiconductor reacts with oxygen bonded to a metal atom to be water, and in addition, vacancies (also referred to as oxygen vacancies) are formed in a lattice from which oxygen is released (or a portion from which oxygen is released). In addition, the reaction of part of hydrogen and oxygen causes generation of electrons serving as carriers. Thus, a transistor including an oxide semiconductor which contains hydrogen is likely to be normally on.

In view of the above, when an oxide semiconductor is used for the semiconductor film 111, it is preferable that hydrogen in the oxide semiconductor film as the semiconductor film 111 be reduced as much as possible. Specifically, the concentration of hydrogen in the semiconductor film 111, which is measured by secondary ion mass spectrometry (SIMS), is set to lower than $5\times10^{18}$ atoms/cm$^3$, preferably lower than or equal to $1\times10^{18}$ atoms/cm$^3$, more preferably lower than or equal to $5\times10^{17}$ atoms/cm$^3$, still more preferably lower than or equal to $1\times10^{16}$ atoms/cm$^3$.

Further, the concentration of alkali metals or alkaline earth metals in the semiconductor film 111, which is measured by secondary ion mass spectrometry (SIMS), is set to lower than or equal to $1\times10^{18}$ atoms/cm$^3$, preferably lower than or equal to $2\times10^{16}$ atoms/cm$^3$. This is because an alkali metal and an alkaline earth metal might generate carriers when bonded to an oxide semiconductor, in which case the off-state current of the transistor 103 might be increased.

Further, when nitrogen is contained in the oxide semiconductor film as the semiconductor film 111, electrons serving as carriers are generated and the carrier density increases, so that the oxide semiconductor film easily becomes n-type. Thus, a transistor including an oxide semiconductor which contains nitrogen is likely to be normally on. For this reason, nitrogen in the oxide semiconductor film is preferably reduced as much as possible; the concentration of nitrogen is preferably set to, for example, lower than or equal to $5\times10^{18}$ atoms/cm$^3$.

When such an oxide semiconductor film highly purified by reducing impurities (such as hydrogen, nitrogen, an alkali metal, and an alkaline earth metal) as much as possible is used as the semiconductor film 111, the transistor 103 can be prevented from being normally on, so that the off-state current of the transistor 103 can be significantly reduced. Accordingly, a semiconductor device having favorable electrical characteristics can be fabricated. Further, a semiconductor device with improved reliability can be fabricated.

Note that various experiments can prove low off-state current of a transistor including a highly purified oxide semiconductor film. For example, even when an element has a channel width W of $1\times10^6$ μm and a channel length L of 10 μm, the off-state current can be lower than or equal to the measurement limit of a semiconductor parameter analyzer, i.e., lower than or equal to $1\times10^{-13}$ A, at voltages (drain voltages) between a source and a drain of 1 V to 10 V. In that case, it is found that the off-state current corresponding to a value obtained by dividing the off-state current by the channel width of the transistor is lower than or equal to 100 zA/μm. Further, the off-state current was measured with the use of a circuit in which a capacitor and a transistor are connected to each other and charge that flows in or out from the capacitor is controlled by the transistor. In the measurement, a highly purified oxide semiconductor film has been used for a channel formation region of the transistor, and the off-state current of the transistor has been measured from change in the amount of charge of the capacitor per unit time. As a result, it was found that in the case where the voltage between the source electrode and the drain electrode of the transistor is 3 V, lower off-state current of several tens of yoctoamperes per micrometer (yA/μm) can be obtained. Accordingly, the transistor including a highly purified oxide semiconductor film has extremely low off-state current.

Figure 3:
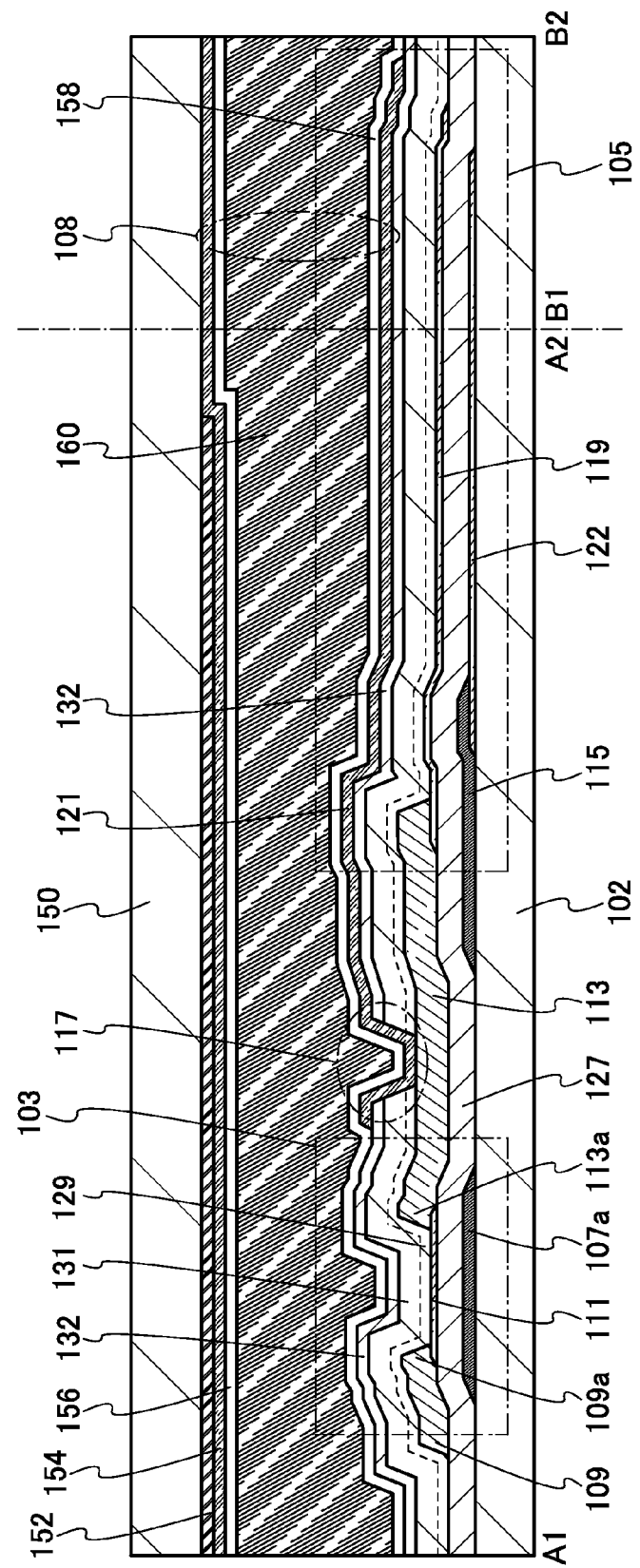
FIG. 3 is a cross-sectional view illustrating a semiconductor device of one embodiment of the present invention.

Next, FIG. 3 is a cross-sectional view taken along dashed-dotted lines A1-A2 and B1-B2 in FIG. 2.

A cross-sectional structure of the pixel 101 of the liquid crystal display device is as follows. The liquid crystal display device includes an element portion over a substrate 102, an element portion on a substrate 150, and a liquid crystal layer sandwiched between the two element portions.

First, the structure of the element portion formed over the substrate 102 will be described. The electrode 122 functioning as one electrode of the capacitor 105, the scan line 107 functioning as the gate electrode of the transistor 103, and the capacitor line 115 over the same surface as the scan line 107 are provided over the substrate 102. The gate insulating film 127 is provided over the electrode 122, the scan line 107, and the capacitor line 115. Although an example in which the gate insulating film 127 is a stack of a gate insulating film 127a and a gate insulating film 127b is illustrated in FIG. 3, the gate insulating film 127 may be a single layer or a stack of three or more layers.

The semiconductor film 111 is provided over a portion of the gate insulating film 127 which overlaps with the scan line 107, and the semiconductor film 119 is provided over a portion of the gate insulating film 127 which overlaps with the electrode 122. The semiconductor film 119 can be formed concurrently with the semiconductor film 111 in the same layer as the semiconductor film 111.

The signal line 109 functioning as the source electrode of the transistor 103 and the conductive film 113 functioning as the drain electrode of the transistor 103 are provided over the semiconductor film 111 and the gate insulating film 127. The conductive film 113 is connected to the semiconductor film 119. An insulating film 129, an insulating film 131, and an insulating film 132 functioning as protective insulating films of the transistor 103 are provided over the gate insulating film 127, the signal line 109, the semiconductor film 111, the conductive film 113, and the semiconductor film 119. The opening 117 reaching the conductive film 113 is formed in the insulating film 129, the insulating film 131, and the insulating film 132, and the pixel electrode 121 is provided in the opening 117 and over the insulating film 132. An insulating film 158 functioning as an alignment film is provided over the pixel electrode 121 and the insulating film 132. Note that a base insulating film may be provided between the substrate 102, and the electrode 122, the scan line 107, the capacitor line 115, and the gate insulating film 127.

In the capacitor 105 in this structure, one of a pair of electrodes is the electrode 122, the other of the pair of electrodes is the semiconductor film 119, and a dielectric film provided between the pair of electrodes is the gate insulating film 127.

The details of the components of the above structure will be described below.

Although there is no particular limitation on a material and the like of the substrate 102, it is necessary that the substrate have heat resistance high enough to withstand at least heat treatment performed in a fabrication process of a semiconductor device. Examples of the substrate are a glass substrate, a ceramic substrate, and a plastic substrate, and as the glass substrate, an alkali-free glass substrate such as a barium borosilicate glass substrate, an aluminoborosilicate glass substrate, or an aluminosilicate glass substrate is preferably used. Alternatively, a non-light-transmitting substrate such as a stainless alloy substrate may be used, in which case a surface of the substrate is preferably provided with an insulating film. As the substrate 102, any of the following may alternatively be used: a quartz substrate, a sapphire substrate, a single crystal semiconductor substrate, a polycrystalline semiconductor substrate, a compound semiconductor substrate, and a silicon on insulator (SOI) substrate.

The electrode 122 can be formed using a light-transmitting conductive material similar to that used for the pixel electrode 121 described later. Alternatively, a light-transmitting oxide semiconductor material similar to that used for the semiconductor film 111 described later can be used for the electrode 122. The electrode 122 can have a thickness of greater than or equal to 5 nm and less than or equal to 300 nm, preferably greater than or equal to 10 nm and less than or equal to 150 nm.

The scan line 107 and the capacitor line 115, through which a large amount of current flows, are preferably formed using a metal film; typically, they are formed to have a single-layer structure or a stacked-layer structure using any of metal materials such as molybdenum (Mo), titanium (Ti), tungsten (W), tantalum (Ta), aluminum (Al), copper (Cu), chromium (Cr), neodymium (Nd), or scandium (Sc), or an alloy material which contains any of these materials as its main component.

Examples of the scan line 107 and the capacitor line 115 are a single-layer structure using aluminum containing silicon, a two-layer structure in which titanium is stacked over aluminum, a two-layer structure in which titanium is stacked over titanium nitride, a two-layer structure in which tungsten is stacked over titanium nitride, a two-layer structure in which tungsten is stacked over tantalum nitride, a two-layer structure in which copper is stacked over Cu—Mg—Al alloy, and a three-layer structure in which titanium nitride, copper, and tungsten are stacked in this order.

As a material of the scan line 107 and the capacitor line 115, a light-transmitting conductive material which can be used for the pixel electrode 121 can be used.

Alternatively, as a material of the scan line 107 and the capacitor line 115, a metal oxide containing nitrogen, specifically, an In—Ga—Zn-based oxide containing nitrogen, an In—Sn-based oxide containing nitrogen, an In—Ga-based oxide containing nitrogen, an In—Zn-based oxide containing nitrogen, a Sn-based oxide containing nitrogen, an In-based oxide containing nitrogen, or a metal nitride (InN, SnN, or the like) can be used. These materials each have a work function higher than or equal to 5 eV (electron volts). When an oxide semiconductor is used for the semiconductor film 111 in the transistor 103, the use of a metal oxide containing nitrogen for the scan line 107 (the gate electrode of the transistor 103) allows the threshold voltage of the transistor 103 to be shifted in the positive direction, i.e., the transistor can be normally off. For example, in the case of using an In—Ga—Zn-based oxide containing nitrogen, an In—Ga—Zn-based oxide having at least a higher nitrogen concentration than the semiconductor film 111, specifically, an In—Ga—Zn-based oxide having a nitrogen concentration of 7 at. % or higher can be used.

The scan line 107 and the capacitor line 115 are preferably formed using aluminum or copper, which are low resistance materials. When aluminum or copper is used, signal delay is reduced, so that the display quality can be improved. Note that aluminum has low heat resistance, and thus a defect due to hillocks, whiskers, or migration is easily generated. To prevent migration of aluminum, a layer of a metal material having a higher melting point than aluminum, such as molybdenum, titanium, or tungsten, is preferably stacked over an aluminum layer. Also in the case where copper is used, in order to prevent a defect due to migration and diffusion of copper elements, a layer of a metal material having a higher melting point than copper, such as molybdenum, titanium, or tungsten, is preferably stacked over a copper layer.

The gate insulating film 127 is formed to have a single-layer structure or a stacked-layer structure using, for example, any of insulating materials such as silicon oxide, silicon oxynitride, silicon nitride oxide, silicon nitride, aluminum oxide, hafnium oxide, gallium oxide, and a Ga—Zn-based metal oxide. In order to improve the characteristics of the interface between the gate insulating film 127 and the oxide semiconductor film as the semiconductor film 111, a region in the gate insulating film 127 which is in contact with at least the semiconductor film 111 is preferably formed using an oxide insulating film.

Further, it is possible to prevent outward diffusion of oxygen from the oxide semiconductor film as the semiconductor film 111 and entry of hydrogen, water, or the like into the oxide semiconductor film from the outside by providing an insulating film having a barrier property against oxygen, hydrogen, water, and the like for the gate insulating film 127. Examples of the insulating film having a barrier property against oxygen, hydrogen, water, and the like are an aluminum oxide film, an aluminum oxynitride film, a gallium oxide film, a gallium oxynitride film, an yttrium oxide film, an yttrium oxynitride film, a hafnium oxide film, a hafnium oxynitride film, and a silicon nitride film.

In general, a capacitor includes two electrodes that face each other and a dielectric sandwiched therebetween, and as the thickness of the dielectric is smaller (as the distance between the two facing electrodes is shorter) or as the dielectric constant of the dielectric is higher, the capacitance becomes higher. However, when the thickness of the dielectric is reduced in order to increase the capacitance of the capacitor, leakage current flowing between the two electrodes tends to be increased and the withstand voltage of the capacitor tends to be lowered.

As well as the capacitor 105, a portion where the gate electrode (the scan line 107), the gate insulating film 127, and the semiconductor film 111 of the transistor 103 overlap with one another functions as the above-described capacitor (hereinafter also referred to as "gate capacitor"). A channel is formed in a region in the semiconductor film 111, which overlaps with the gate electrode with the gate insulating film 127 provided therebetween. In other words, the gate electrode and the channel formation region function as two electrodes of the capacitor, and the gate insulating film functions as a dielectric of the capacitor. Although it is preferable that the capacitance of the gate capacitor be as high as possible, a reduction in the thickness of the gate insulating film 127 for the purpose of increasing the capacitance increases the probability of occurrence of an increase in the leakage current or a reduction in the withstand voltage.

In the case where a high-k material such as hafnium silicate ($HfSiO_x$), hafnium silicate containing nitrogen ($HfSi_xO_yN_z$), hafnium aluminate containing nitrogen ($HfAl_xO_yN_z$), hafnium oxide, or yttrium oxide is used for the gate insulating film 127, even if the thickness of the gate insulating film 127 is made thick, sufficient capacitance between the gate electrode and the semiconductor film 111 can be ensured.

For example, in the case where a high-k material with a high dielectric constant is used for the gate insulating film 127, even when the gate insulating film 127 is made thick, a capacitance similar to that in the case of using silicon oxide for the gate insulating film 127 can be obtained. This enables a reduction in leakage current between the gate electrode and the semiconductor film 111. Further, leakage current between a wiring formed using the same layer as the gate electrode and another wiring that overlaps with the wiring can be reduced. The gate insulating film 127 may have a stacked-layer structure of the high-k material and another material selected from those given above.

The gate insulating film 127 preferably has the following stacked-layer structure. It is preferable that a silicon nitride film having fewer defects be provided as a first silicon nitride film, a silicon nitride film from which less hydrogen and ammonia are released be provided as a second silicon nitride film over the first silicon nitride film, and any of the oxide insulating films listed as those used for the gate insulating film 127 be provided over the second silicon nitride film.

As the second silicon nitride film, a nitride insulating film which releases hydrogen molecules less than $5\times10^{21}$ molecules/cm$^3$, preferably less than or equal to $3\times10^{21}$ molecules/cm$^3$, more preferably less than or equal to $1\times10^{21}$ molecules/cm$^3$, and ammonia molecules less than $1\times10^{22}$ molecules/cm$^3$, preferably less than or equal to $5\times10^{21}$ molecules/cm$^3$, more preferably less than or equal to $1\times10^{21}$ molecules/cm$^3$ by thermal desorption spectroscopy is preferably used. The first silicon nitride film and the second silicon nitride film are used as part of the gate insulating film 127, whereby a gate insulating film which has fewer defects and from which less hydrogen and ammonia are released can be formed as the gate insulating film 127. Thus, the amount of hydrogen and nitrogen contained in the gate insulating film 127, which enter the semiconductor film 111 can be reduced.

In the case where the trap level (also referred to as interface level) is present at the interface between an oxide semiconductor film and a gate insulating film or in the gate insulating film in a transistor including an oxide semiconductor, a shift of the threshold voltage of the transistor, typically, a shift of the threshold voltage in the negative direction, and an increase in the subthreshold swing (S value) showing a gate voltage needed for changing the drain current by an order of magnitude when the transistor is turned on are caused. As a result, there is a problem in that electrical characteristics vary among transistors. For this reason, when, as the gate insulating film 127, the silicon nitride film with a small number of defects is used, and the oxide insulating film is provided in a region of the gate insulating film 127, which is in contact with the semiconductor film 111, a negative shift of the threshold voltage and an increase of an S value can be suppressed.

The thickness of the gate insulating film 127 is greater than or equal to 5 nm and less than or equal to 400 nm, preferably greater than or equal to 10 nm and less than or equal to 300 nm, more preferably greater than or equal to 50 nm and less than or equal to 250 nm.

The semiconductor film 111 and the semiconductor film 119 are oxide semiconductor films which can be amorphous, single-crystalline, or polycrystalline. The thickness of the semiconductor film 111 is greater than or equal to 1 nm and less than or equal to 100 nm, preferably greater than or equal to 1 nm and less than or equal to 50 nm, more preferably greater than or equal to 1 nm and less than or equal to 30 nm, still more preferably greater than or equal to 3 nm and less than or equal to 20 nm.

An oxide semiconductor which can be used for the semiconductor film 111 and the semiconductor film 119 has an energy gap of greater than or equal to 2 eV, preferably greater than or equal to 2.5 eV, more preferably greater than or equal to 3 eV. The use of such an oxide semiconductor having a wide energy gap can reduce the off-state current of the transistor 103.

An oxide semiconductor containing at least indium (In) or zinc (Zn) is preferably used for the semiconductor film 111. Alternatively, both In and Zn are preferably contained. In order to reduce variations in electrical characteristics of the transistors including the oxide semiconductor, the oxide semiconductor preferably contains one or more stabilizers in addition to one of or both In and Zn.

As for stabilizers, gallium (Ga), tin (Sn), hafnium (Hf), aluminum (Al), and zirconium (Zr) can be given as examples. As another stabilizer, lanthanoids such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu) can be given as examples.

For an oxide semiconductor which can be used for the semiconductor film 111 and the semiconductor film 119, for example, the following can be used: indium oxide; tin oxide; zinc oxide; an oxide containing two kinds of metals, such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; an oxide containing three kinds of metals, such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—Zr—Zn-based oxide, an In—Ti—Zn-based oxide, an In—Sc—Zn-based oxide, an In—Y—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; or an oxide containing four kinds of metals, such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide.

Here, an "In—Ga—Zn-based oxide" means an oxide containing In, Ga, and Zn as its main components and there is no particular limitation on the ratio of In, Ga, and Zn. Further, the In—Ga—Zn-based oxide may contain a metal element other than In, Ga, and Zn.

Alternatively, a material represented by $InMO_3(ZnO)_m$ (m>0) may be used as an oxide semiconductor. Note that M represents one or more metal elements selected from Ga, Fe, Mn, and Co, or the above element as a stabilizer. Still alternatively, a material represented by $In_2SnO_5(ZnO)_7$, (n>0) may be used as the oxide semiconductor.

For example, it is possible to use an In—Ga—Zn-based metal oxide containing In, Ga, and Zn at an atomic ratio of 1:1:1 (=$\frac{1}{3}:\frac{1}{3}:\frac{1}{3}$), 2:2:1 (=$\frac{2}{5}:\frac{2}{5}:\frac{1}{5}$), or 3:1:2 (=$\frac{1}{2}:\frac{1}{6}:\frac{1}{3}$). Alternatively, an In—Sn—Zn-based metal oxide containing In, Sn, and Zn at an atomic ratio of 1:1:1 (=$\frac{1}{3}:\frac{1}{3}:\frac{1}{3}$), 2:1:3 (=$\frac{1}{3}:\frac{1}{6}:\frac{1}{2}$), or 2:1:5 (=$\frac{1}{4}:\frac{1}{8}:\frac{5}{8}$) may be used. Note that a proportion of each atom in the atomic ratio of the metal oxide varies within a range of ±20% as an error.

However, the composition is not limited to those described above, and a material having the appropriate composition may be used depending on needed semiconductor characteristics and electrical characteristics (e.g., field-effect mobility, threshold voltage, and variation). In order to obtain needed semiconductor characteristics, it is preferable that the carrier density, the impurity concentration, the defect density, the atomic ratio of a metal element and oxygen, the interatomic distance, the density, and the like be set to be appropriate. For example, high field-effect mobility can be obtained relatively easily in the case of using an In—Sn—Zn-based oxide. Also in the case of using an In—Ga—Zn-based oxide, field-effect mobility can be increased by reducing the defect density in a bulk.

The signal line 109 functioning as the source electrode of the transistor 103 and the conductive film 113 functioning as the drain electrode of the transistor 103 can be formed to have a single-layer structure or a stacked-layer structure using a material similar to that of the scan line 107 and the capacitor line 115.

The insulating films 129, 131, and 132 functioning as the protective insulating films of the transistor 103 each can be formed using a material similar to that of the gate insulating film 127. It is particularly preferable that the insulating films 129 and 131 be oxide insulating films and the insulating film 132 be a nitride insulating film. The use of a nitride insulating film as the insulating film 132 can suppress entry of impurities such as hydrogen and water into the transistor 103 (in particular, the semiconductor film 111) from the outside. Note that the insulating film 129 is not necessarily provided.

Further, an oxide insulating film in which the oxygen content is higher than that in the stoichiometric composition is preferably used as one of or both the insulating film 129 and the insulating film 131. In that case, oxygen can be prevented from being released from the oxide semiconductor film, and the oxygen contained in the oxide insulating film can enter the oxide semiconductor film to fill oxygen vacancies. For example, when an oxide insulating film having the following feature is used, oxygen vacancies in the oxide semiconductor film can be filled. The feature of the oxide insulating film is that the number of oxygen molecules released from the oxide insulating film is greater than or equal to $1.0 \times 10^{18}$ molecules/$cm^3$ when measured by thermal desorption spectroscopy (hereinafter referred to as TDS spectroscopy). Note that an oxide insulating film partly including a region in which the oxygen content is higher than that in the stoichiometric composition (oxygen excess region) may be used as one of or both the insulating film 129 and the insulating film 131. When such an oxygen excess region is present in a region overlapping with at least the semiconductor film 111, oxygen is prevented from being released from the oxide semiconductor film and the oxygen contained in the oxygen excess region can enter the oxide semiconductor film to fill oxygen vacancies.

In the case where the insulating film 131 is an oxide insulating film in which the oxygen content is higher than that in the stoichiometric composition, the insulating film 129 is preferably an oxide insulating film through which oxygen penetrates. Oxygen which enters the insulating film 129 from the outside does not completely penetrate through the insulating film 129 to be transferred and part thereof remains in the insulating film 129. Further, there is oxygen which is contained in the insulating film 129 from the first and is transferred from the insulating film 129 to the outside. Thus, the insulating film 129 preferably has a high coefficient of diffusion of oxygen.

Since the insulating film 129 is in contact with the oxide semiconductor film as the semiconductor film 111, the insulating film 129 is preferably an oxide insulating film through which oxygen penetrates and which has fewer interface states between the semiconductor film 111 and the oxide insulating film. For example, the insulating film 129 is preferably an oxide insulating film having a lower defect density than the insulating film 131. Specifically, the spin density of the oxide insulating film at a g-value of 2.001 (F-center) measured by electron spin resonance spectroscopy is lower than or equal to $3.0 \times 10^{17}$ spins/cm$^3$, preferably lower than or equal to $5.0 \times 10^{16}$ spins/cm$^3$. The spin density at a g-value of 2.001 measured by electron spin resonance spectroscopy corresponds to the number of dangling bonds in the insulating film 129.

The insulating film 129 can have a thickness of greater than or equal to 5 nm and less than or equal to 150 nm, preferably greater than or equal to 5 nm and less than or equal to 50 nm, more preferably greater than or equal to 10 nm and less than or equal to 30 nm. The insulating film 131 can have a thickness of greater than or equal to 30 nm and less than or equal to 500 nm, preferably greater than or equal to 150 nm and less than or equal to 400 nm.

In the case where a nitride insulating film is used as the insulating film 132, an insulating film having a barrier property against nitrogen is preferably used as one of or both the insulating film 129 and the insulating film 131. For example, a dense oxide insulating film has a barrier property against nitrogen. Specifically, an oxide insulating film which can be etched at a rate of less than or equal to 10 nm per minute when the temperature is 25° C. and 0.5 wt % of fluoric acid is used is preferably used.

In the case where an oxide insulating film containing nitrogen, such as a silicon oxynitride film or a silicon nitride oxide film, is used as one of or both the insulating film 129 and the insulating film 131, the nitrogen concentration measured by SIMS is greater than or equal to the lower limit of measurement by SIMS and less than $3 \times 10^{20}$ atoms/cm$^3$, preferably greater than or equal to $1 \times 10^{18}$ atoms/cm$^3$ and less than or equal to $1 \times 10^{20}$ atoms/cm$^3$. In that case, the amount of nitrogen which enters the semiconductor film 111 included in the transistor 103 can be reduced and the number of defects in the nitrogen-containing oxide insulating film itself can be reduced.

As the insulating film 132, a nitride insulating film where the hydrogen content is low may be provided. The nitride insulating film is as follows, for example: the number of hydrogen molecules released from the nitride insulating film is less than $5.0 \times 10^{21}$ molecules/cm$^3$, preferably less than $3.0 \times 10^{21}$ molecules/cm$^3$, more preferably less than $1.0 \times 10^{21}$ molecules/cm$^3$ when measured by TDS spectroscopy.

The insulating film 132 has a thickness large enough to prevent entry of impurities such as hydrogen and water from the outside. For example, the thickness can be greater than or equal to 50 nm and less than or equal to 200 nm, preferably greater than or equal to 50 nm and less than or equal to 150 nm, more preferably greater than or equal to 50 nm and less than or equal to 100 nm.

The pixel electrode 121 can be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

Next, the structure of the element portion formed on the substrate 150 will be described. A light-blocking film 152 is provided on the substrate 150, an electrode (a counter electrode 154) is provided on the light-blocking film 152 so as to face the pixel electrode 121, and an insulating film 156 which functions as an alignment film is provided on the counter electrode 154.

The light-blocking film 152 prevents the transistor 103 from being irradiated with light from a backlight or the outside. The light-blocking film 152 can be formed using a material such as a metal or an organic resin including a pigment and may be provided in a region outside the pixel portion 100, such as over the scan line driver circuit 104 and over the signal line driver circuit 106 (see FIG. 1A), as well as over the transistor 103 in the pixel 101.

Note that a coloring film which transmits light with a predetermined wavelength may be provided between a space between the light-blocking films 152 adjacent to each other. Further, an overcoat film may be provided between the counter electrode 154, and the light-blocking films 152 and the coloring film.

The counter electrode 154 is formed using any of the light-transmitting conductive materials given as those used for the pixel electrode 121 as appropriate.

The liquid crystal element 108 includes the pixel electrode 121, the counter electrode 154, and a liquid crystal layer 160. The liquid crystal layer 160 is sandwiched between the insulating film 158 which is provided in the element portion over the substrate 102 and functions as an alignment film and the insulating film 156 which is provided in the element portion on the substrate 150 and functions as an alignment film. Further, the pixel electrode 121 overlaps with the counter electrode 154 with the liquid crystal layer 160 interposed therebetween.

Here, connection of the components included in the pixel 101 described in this embodiment is described with reference to the circuit diagram in FIG. 1C and the cross-sectional view in FIG. 3.

FIG. 1C is an example of a detailed circuit diagram of the pixel 101 included in the semiconductor device illustrated in FIG. 1A. As illustrated in FIG. 1C and FIG. 3, the transistor 103 includes the scan line 107 including the gate electrode 107a, the signal line 109 including the source electrode 109a, and the conductive film 113 including the drain electrode 113a.

In the capacitor 105, the electrode 122 connected to the capacitor line 115 functions as one electrode, the semiconductor film 119 connected to the conductive film 113 including the drain electrode 113a functions as the other electrode, and the gate insulating film 127 provided between the semiconductor film 119 and the electrode 122 functions as a dielectric film.

The liquid crystal element 108 includes the pixel electrode 121, the counter electrode 154, and the liquid crystal layer 160 provided between the pixel electrode 121 and the counter electrode 154.

Despite having the same structure as the semiconductor film 111, the semiconductor film 119 in the capacitor 105 can function as the electrode of the capacitor 105. That is, the semiconductor film 119 is made n-type by controlling a potential applied to the capacitor line 115, so that the semiconductor film 119 has higher conductivity and thus can function as one electrode of the capacitor. In other words, the capacitor 105 can be a MOS capacitor. Specifically, the potential applied to the capacitor line 115 is set as follows. The potential of the pixel electrode 121 is changed in the positive direction and the negative direction in order to operate the liquid crystal element 108 (see FIG. 1C). The potential of the capacitor line 115 needs to be constantly higher than the potential applied to the pixel electrode 121 by the threshold voltage of the capacitor 105 (MOS capacitor) or more in order that the semiconductor film 119 be constantly n-type. Note that the dielectric film of the capacitor 105 and the gate insulating film of the transistor 103 are formed using the same insulating film. Thus, the potential of the capacitor line 115 should be made higher than the potential applied to the pixel electrode 121 by the threshold voltage of the transistor 103 or more. In such a manner, the semiconductor film 119 can be made n-type to have higher conductivity.

An oxide insulating film through which oxygen penetrates and which has fewer interface states between the semiconductor films 111 and 119 and the oxide insulating film is used as the insulating film 129 over the semiconductor films 111 and 119, and an oxide insulating film which includes an oxygen excess region or an oxide insulating film in which the oxygen content is higher than that in the stoichiometric composition is used as the insulating film 131. In such a case, oxygen can be easily supplied to the oxide semiconductor films as the semiconductor films 111 and 119, the release of oxygen from the oxide semiconductor films can be prevented, and the oxygen contained in the insulating film 131 can enter the oxide semiconductor films to fill oxygen vacancies in the oxide semiconductor films. Thus, the transistor 103 can be prevented from being normally on and a potential to be supplied to the capacitor line 115 can be controlled so that the capacitor 105 (MOS capacitor) can be constantly in a conductive state; thus, the semiconductor device can have favorable electrical characteristics and high reliability.

The use of a nitride insulating film as the insulating film 132 over the insulating film 131 can suppress entry of impurities such as hydrogen and water into the semiconductor film 111 and the semiconductor film 119 from the outside. Moreover, the use of a nitride insulating film with a low hydrogen content as the insulating film 132 can suppress variations in the electrical characteristics of the transistor 103 and the capacitor 105 (MOS capacitor).

Further, the capacitor 105 can be formed large (in a large area) in the pixel 101. For this reason, the semiconductor device can have charge capacity increased while the aperture ratio is improved. Further, with the improved aperture ratio, the semiconductor device can have excellent display quality.

Further, in the semiconductor device of one embodiment of the present invention, a region of the pixel 101, in which the light-blocking film 152 is provided, can be reduced or removed in such a manner that a polarization axis of a polarizing member (a polarizing substrate) is provided to be in parallel to the light-blocking film 152, and the display mode of the semiconductor device is set to a normally-black mode in which the liquid crystal element 108 does not transmit light from a light source device such as a backlight with no voltage applied. As a result, the aperture ratio of the pixel 101 can be improved even in the case where the size of one pixel is small as in a display device having a high resolution, where the pixel density is 200 ppi or more, further 300 ppi or more. Note that the aperture ratio can be further increased by using a light-transmitting capacitor.

<Method for Fabricating Semiconductor Device>

Next, a formation method of the element portion over the substrate 102 in the semiconductor device described above will be described with reference to FIGS. 4A and 4B and FIGS. 5A and 5B.

First, the electrode 122 is formed over the substrate 102, and then the scan line 107 and the capacitor line 115 are formed. The gate insulating film 127 is formed so as to cover the electrode 122, the scan line 107, and the capacitor line 115. The semiconductor film 111 is formed over a portion of the gate insulating film 127 which overlaps with the scan line 107. The semiconductor film 119 is formed over a portion of the gate insulating film 127 which overlaps with the electrode 122 (see FIG. 4A).

The electrode 122 can be formed in the following manner: a film is formed over the substrate 102 using any of the light-transmitting conductive materials given above, which is similar to that used for the pixel electrode 121; a resist mask is formed over the film by a photolithography method, an ink-jet method, or the like; and then the film is selectively etched using the resist mask. The film can be processed by one of or both dry etching and wet etching. After the etching, the resist mask is removed. Alternatively, the electrode 122 can be formed using a light-transmitting oxide semiconductor material.

Note that a process in which a resist mask having an appropriate shape is formed over a conductive layer, an insulating layer, a semiconductor layer, or the like by a photolithography method is referred to as a photolithography process; in general, after the formation of the resist mask, an etching step, an ion implantation step, or the like is performed and then the resist mask is removed in many cases. Thus, unless otherwise specified, a photolithography process in this specification includes the steps from the formation of a resist mask to the removal of the resist mask.

In this embodiment, a 100-nm-thick oxide semiconductor film is formed as the electrode 122 over the substrate 102. After the formation of the electrode 122, a step of adding a dopant to the electrode 122 may be performed. The oxide semiconductor film is made n-type by adding the dopant to the electrode 122; thus, the conductivity of the electrode 122 can be increased. The n-type oxide semiconductor film can function as a conductive film. As the dopant for increasing conductivity, boron, nitrogen, fluorine, aluminum, phosphorus, arsenic, indium, tin, antimony, a rare gas element, or the like can be used. An ion implantation method, an ion doping method, or the like may be employed to add the element to the electrode 122. Alternatively, the electrode 122 may be exposed to plasma containing the element so that the element can be added.

The scan line 107 and the capacitor line 115 can be formed in such a manner that a conductive film is formed using any of the materials given above, a mask is formed over the conductive film, and processing is performed using the mask. The conductive film can be formed by any of a variety of deposition methods such as an evaporation method, a CVD method, a sputtering method, and a spin coating method. Note that there is no particular limitation on the thickness of the conductive film, and the thickness of the conductive film can be determined in consideration of time needed for the formation, desired resistivity, or the like. As the mask, a resist mask formed through a photolithography process can be used. The conductive film can be processed by one of or both dry etching and wet etching.

The gate insulating film 127 can be formed by any of a variety of deposition methods such as a CVD method and a sputtering method.

In the case where gallium oxide is used for the gate insulating film 127, the gate insulating film 127 can be formed by a metal organic chemical vapor deposition (MOCVD) method.

In the case where an oxide semiconductor film is used as the electrode 122, a nitride insulating film may be used for a region of the gate insulating film 127 which is in contact with the electrode 122 in order to increase the conductivity of the electrode 122. When heat treatment is performed with the nitride insulating film being in contact with the electrode 122, nitrogen contained in the nitride insulating film can be transferred to the electrode 122. Thus, the step of adding a dopant can be skipped, which leads to a reduction in the manufacturing cost of the semiconductor device and improvement of the yield thereof.

The semiconductor film 111 and the semiconductor film 119 can be formed in such a manner that any of the oxide semiconductor films given above is formed, a mask is formed over the formed oxide semiconductor film, and the oxide semiconductor film is processed using the mask. The oxide semiconductor film can be formed by a sputtering method, a coating method, a pulsed laser deposition method, a laser ablation method, or the like. By employing a printing method, the semiconductor film 111 and the semiconductor film 119 which are separate from each other can be formed directly on the gate insulating film 127. As a power supply device for generating plasma in the case of forming the oxide semiconductor film by a sputtering method, an RF power supply device, an AC power supply device, a DC power supply device, or the like can be used as appropriate. As a sputtering gas, a rare gas (typically argon), oxygen, or a mixed gas of a rare gas and oxygen is used as appropriate. In the case of using the mixed gas of a rare gas and oxygen, the proportion of oxygen is preferably higher than that of a rare gas. Further, a target may be appropriately selected in accordance with the composition of the oxide semiconductor film to be formed. As the mask, a resist mask formed through a photolithography process can be used. The oxide semiconductor film can be processed by one of or both dry etching and wet etching. Etching conditions (an etching gas, an etchant, etching time, temperature, and the like) are appropriately set in accordance with a material so that etching can be performed to form a desired shape.

After the formation of the semiconductor film 111 and the semiconductor film 119, a mask covering the semiconductor film 111 may be formed and a dopant for making the semiconductor film 119 n-type to increase the conductivity thereof may be added. As the dopant for increasing conductivity, boron, nitrogen, fluorine, aluminum, phosphorus, arsenic, indium, tin, antimony, a rare gas element, or the like can be used. An ion implantation method, an ion doping method, or the like may be employed to add the element to the semiconductor film 119. Alternatively, the semiconductor film 119 may be exposed to plasma containing the element so that the element can be added. The n-type oxide semiconductor film can function as a conductive film.

Heat treatment is preferably performed after formation of the semiconductor films 111 and 119 or after addition of the dopant for increasing conductivity to dehydrate or dehydrogenate the oxide semiconductor films as the semiconductor films 111 and 119. The temperature of the heat treatment is typically higher than or equal to 150° C. and lower than the strain point of the substrate, preferably higher than or equal to 200° C. and lower than or equal to 450° C., further preferably higher than or equal to 300° C. and lower than or equal to 450° C. Note that the heat treatment may be performed on the oxide semiconductor film which has not been processed into the semiconductor films 111 and 119.

A heat treatment apparatus used in the heat treatment is not limited to an electric furnace; as the heat treatment apparatus, an apparatus which heats an object using thermal conduction or thermal radiation given by a medium such as a heated gas may be used. For example, a rapid thermal annealing (RTA) apparatus such as a gas rapid thermal annealing (GRTA) apparatus or a lamp rapid thermal annealing (LRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas.

The heat treatment may be performed in an atmosphere of nitrogen, oxygen, ultra-dry air (air in which the water content is less than or equal to 20 ppm, preferably less than or equal to 1 ppm, more preferably less than or equal to 10 ppb), or a rare gas (e.g., argon or helium). The atmosphere of nitrogen, oxygen, ultra-dry air, or a rare gas preferably does not contain hydrogen, water, and the like. Alternatively, heating may be performed in an inert gas atmosphere first, and then in an oxygen atmosphere. The treatment time is three minutes to 24 hours.

In the case where a base insulating film is provided between the substrate 102, and the scan line 107, the capacitor line 115, and the gate insulating film 127, the base insulating film can be formed using any of the following: silicon oxide, silicon oxynitride, silicon nitride, silicon nitride oxide, gallium oxide, hafnium oxide, yttrium oxide, aluminum oxide, aluminum oxynitride, and the like. The use of silicon nitride, gallium oxide, hafnium oxide, yttrium oxide, aluminum oxide, or the like for the base insulating film leads to suppression of diffusion of impurities typified by an alkali metal, water, and hydrogen into the semiconductor film 111 from the substrate 102. The base insulating film can be formed by a sputtering method or a CVD method.

Next, the signal line 109 functioning as the source electrode of the transistor 103 and the conductive film 113 functioning as the drain electrode of the transistor 103 are formed (see FIG. 4B).

The signal line 109 and the conductive film 113 can be formed in such a manner that a conductive film is formed using a material that can be used for the signal line 109 and the conductive film 113, a mask is formed over the conductive film, and the conductive film is processed using the mask. The formation of the mask and the processing can be performed in manners similar to those of the scan line 107 and the capacitor line 115.

Then, an insulating film 128 is formed over the semiconductor film 111, the semiconductor film 119, the signal line 109, the conductive film 113, and the gate insulating film 127, an insulating film 130 is formed over the insulating film 128, and an insulating film 133 is formed over the insulating film 130 (see FIG. 5A). The insulating film 128, the insulating film 130, and the insulating film 133 are preferably formed successively, in which case entry of impurities into each interface can be suppressed.

The insulating film 128 can be formed using a material which can be used for the insulating film 129, by any of a variety of deposition methods such as a CVD method and a sputtering method. The insulating film 130 can be formed using a material which can be used for the insulating film 131. The insulating film 133 can be formed using a material which can be used for the insulating film 132.

In the case where an oxide insulating film which has fewer interface states between the semiconductor film 111 and the oxide insulating film is used as the insulating film 129, the insulating film 128 can be formed under the following formation conditions. Here, as the oxide insulating film, a silicon oxide film or a silicon oxynitride film is formed. As for the formation conditions, the substrate placed in a treatment chamber of a plasma CVD apparatus, which is vacuum-evacuated, is held at a temperature higher than or equal to 180° C. and lower than or equal to 400° C., preferably higher than or equal to 200° C. and lower than or equal to 370° C., a deposition gas containing silicon and an oxidizing gas are introduced as a source gas into the treatment chamber, the pressure in the treatment chamber is greater than or equal to 20 Pa and less than or equal to 250 Pa, preferably greater than or equal to 40 Pa and less than or equal to 200 Pa, and high-frequency power is supplied to an electrode provided in the treatment chamber.

Typical examples of the deposition gas containing silicon include silane, disilane, trisilane, and silane fluoride. Examples of the oxidizing gas include oxygen, ozone, dinitrogen monoxide, and nitrogen dioxide.

By setting the ratio of the amount of the oxidizing gas to the amount of the deposition gas containing silicon to 100 or higher, the hydrogen content in the insulating film 128 (the insulating film 129) can be reduced and dangling bonds in the insulating film 128 (the insulating film 129) can be reduced. Oxygen transferred from the insulating film 130 (the insulating film 131) is captured by the dangling bonds in the insulating film 128 (the insulating film 129) in some cases; thus, in the case where the dangling bonds in the insulating film 128 (the insulating film 129) are reduced, oxygen in the insulating film 130 (the insulating film 131) can enter the semiconductor film 111 and the semiconductor film 119 efficiently to fill the oxygen vacancies in the oxide semiconductor films as the semiconductor film 111 and the semiconductor film 119. As a result, the amount of hydrogen which enters the oxide semiconductor films can be reduced and oxygen vacancies in the oxide semiconductor films can be reduced.

In the case where the above oxide insulating film which includes an oxygen excess region or the above oxide insulating film in which the oxygen content is higher than that in the stoichiometric composition is used as the insulating film 131, the insulating film 130 can be formed under the following formation conditions. Here, as the oxide insulating film, a silicon oxide film or a silicon oxynitride film is formed. As for the formation conditions, the substrate placed in a treatment chamber of a plasma CVD apparatus, which is vacuum-evacuated, is held at a temperature higher than or equal to 180° C. and lower than or equal to 260° C., preferably higher than or equal to 180° C. and lower than or equal to 230° C., a source gas is introduced into the treatment chamber, the pressure in the treatment chamber is greater than or equal to 100 Pa and less than or equal to 250 Pa, preferably greater than or equal to 100 Pa and less than or equal to 200 Pa, and high-frequency power that is higher than or equal to 0.17 W/cm$^2$ and lower than or equal to 0.5 W/cm$^2$, preferably, higher than or equal to 0.25 W/cm$^2$ and lower than or equal to 0.35 W/cm$^2$ is supplied is supplied to an electrode provided in the treatment chamber.

As the source gas of the insulating film 130, a source gas which can be used for the insulating film 128 can be used.

As for the formation conditions of the insulating film 130, the high-frequency power having the above power density is supplied to the treatment chamber having the above pressure, whereby the decomposition efficiency of the source gas in plasma is increased, oxygen radicals are increased, and oxidation of the source gas proceeds; therefore, the oxygen content in the insulating film 130 is higher than that in the stoichiometric composition. However, in the case where the substrate temperature is within the above temperature range, the bond between silicon and oxygen is weak, and accordingly, part of oxygen is released by heating. Thus, it is possible to form an oxide insulating film in which the oxygen content is higher than that in the stoichiometric composition and from which part of oxygen is released by heating. The insulating film 128 is provided over the semiconductor film 111. Accordingly, in the process for forming the insulating film 130, the insulating film 128 serves as a protective film of the semiconductor film 111. Thus, even when the insulating film 130 is formed using the high-frequency power having a high power density, damage to the semiconductor film 111 can be suppressed.

By increasing the thickness of the insulating film 130, the amount of oxygen released by heating can be increased; thus, the insulating film 130 is preferably formed thicker than the insulating film 128. Since the insulating film 128 is provided, favorable coverage can be achieved even when the insulating film 130 is formed thick.

In the case where a nitride insulating film with a low hydrogen content is used as the insulating film 132, the insulating film 133 can be formed under the following formation conditions. Here, as the nitride insulating film, a silicon nitride film is formed. As for the formation conditions, the substrate placed in a treatment chamber of a plasma CVD apparatus, which is vacuum-evacuated, is held at a temperature higher than or equal to 80° C. and lower than or equal to 400° C., preferably higher than or equal to 200° C. and lower than or equal to 370° C., a source gas is introduced into the treatment chamber, the pressure in the treatment chamber is greater than or equal to 100 Pa and less than or equal to 250 Pa, preferably greater than or equal to 100 Pa and less than or equal to 200 Pa, and high-frequency power is supplied to an electrode provided in the treatment chamber.

As the source gas of the insulating film 133, a deposition gas containing silicon, nitrogen, and ammonia are preferably used. Typical examples of the deposition gas containing silicon include silane, disilane, trisilane, and silane fluoride. Further, the flow rate of nitrogen is preferably 5 times to 50 times that of ammonia, further preferably 10 times to 50 times that of ammonia. The use of ammonia as the source gas can promote decomposition of the deposition gas containing silicon and nitrogen. This is because ammonia is dissociated by plasma energy or heat energy, and energy generated by the dissociation contributes to decomposition of a bond of the deposition gas molecules containing silicon and a bond of nitrogen molecules. Under the above conditions, a silicon nitride film which has a low hydrogen content and can suppress entry of impurities such as hydrogen and water from the outside can be formed.

It is preferable that heat treatment be performed at least after formation of the insulating film 130 so that excess oxygen contained in the insulating film 128 or the insulating film 130 enters the semiconductor film 111 to fill oxygen vacancies in the oxide semiconductor film as the semiconductor film 111. The heat treatment can be appropriately performed according to the details of heat treatment for dehydration or dehydrogenation of the semiconductor film 111 and the semiconductor film 119.

Then, the opening 117 reaching the conductive film 113 is formed in regions of the insulating film 128, the insulating film 130, and the insulating film 133 which overlap with the conductive film 113 (see FIG. 5B).

The opening 117 can be formed by forming a mask so as to expose part of a region of the insulating film 133 which overlaps with the conductive film 113 and processing the insulating film 128, the insulating film 130, and the insulating film 133 using the mask. The formation of the mask and the processing can be performed in manners similar to those of the scan line 107 and the capacitor line 115.

Finally, the pixel electrode 121 is formed, so that the element portion over the substrate 102 can be formed (see FIG. 3). The pixel electrode 121 is formed in such a manner that a conductive film is formed using any of the materials given above in contact with the conductive film 113 through the opening 117, a mask is formed over the conductive film, and the conductive film is processed using the mask. The formation of the mask and the processing can be performed in manners similar to those of the scan line 107 and the capacitor line 115.

The electrode 122 may be formed so as to extend along the scan line 107. In that case, the step of forming the capacitor line 115 can be skipped.

Modification Example 1

Figure 6:
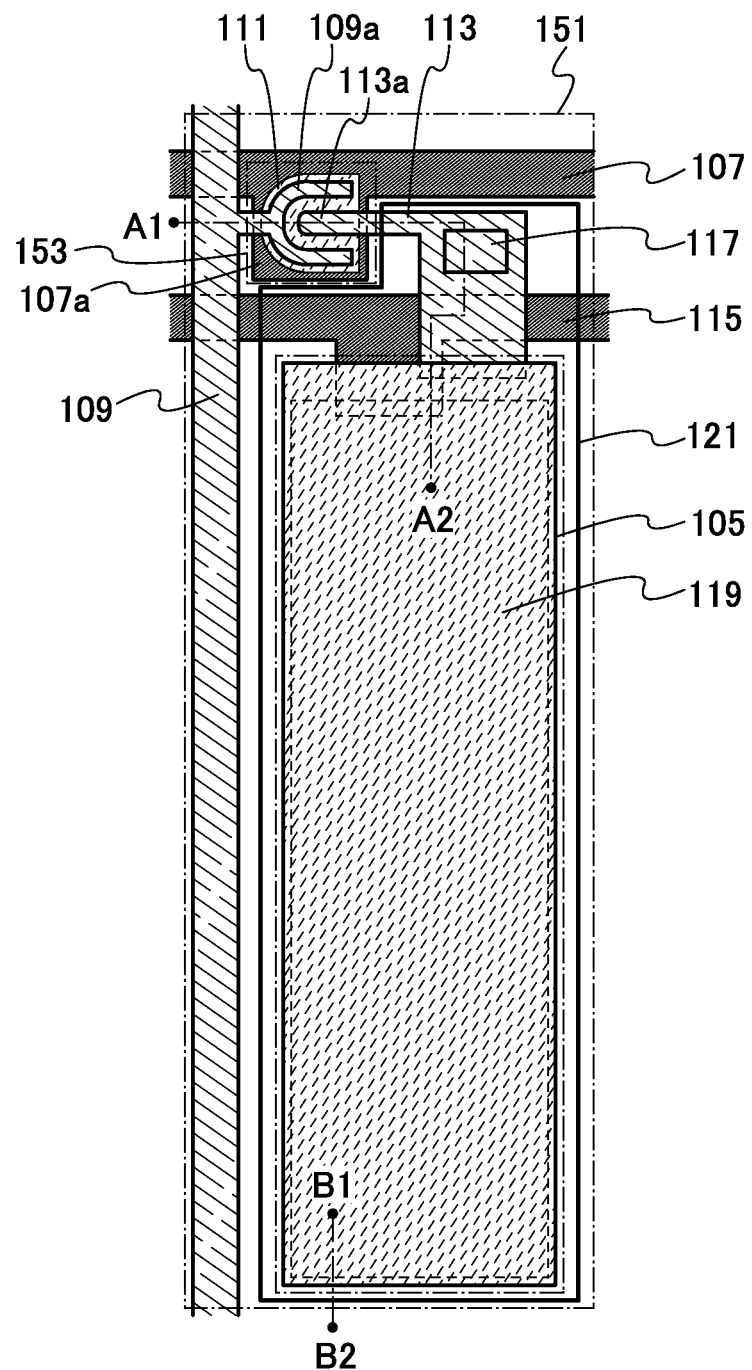
FIG. 6 is a top view illustrating a semiconductor device of one embodiment of the present invention.

In the semiconductor device of one embodiment of the present invention, the shape of a transistor provided in a pixel is not limited to the shape of the transistor illustrated in FIG. 2 and FIG. 3 and can be changed as appropriate. For example, as illustrated in FIG. 6, in a pixel 151, a transistor 153 may be different from the transistor 103 in that a source electrode included in the signal line 109 has a U shape (or a C shape, a square-bracket-like shape, or a horseshoe shape) which partly surrounds the conductive film 113 functioning as a drain electrode. With such a shape, a sufficient channel width can be ensured even when the area of the transistor is small, and accordingly, the amount of drain current flowing at the time of conduction of the transistor (also referred to as an on-state current) can be increased. The structure of the pixel 151 in FIG. 6 is similar to that in FIG. 2, except for the transistor 153.

Modification Example 2

In the semiconductor device of one embodiment of the present invention, the shape of the capacitor line 115 connected to the electrode 122 which is one electrode of the capacitor 105 can be changed as appropriate. For example, the capacitor line 115 can be provided partly in contact with the electrode 122 along the outer periphery thereof in order to reduce contact resistance between the electrode 122 and the capacitor line 115.

Figure 7:
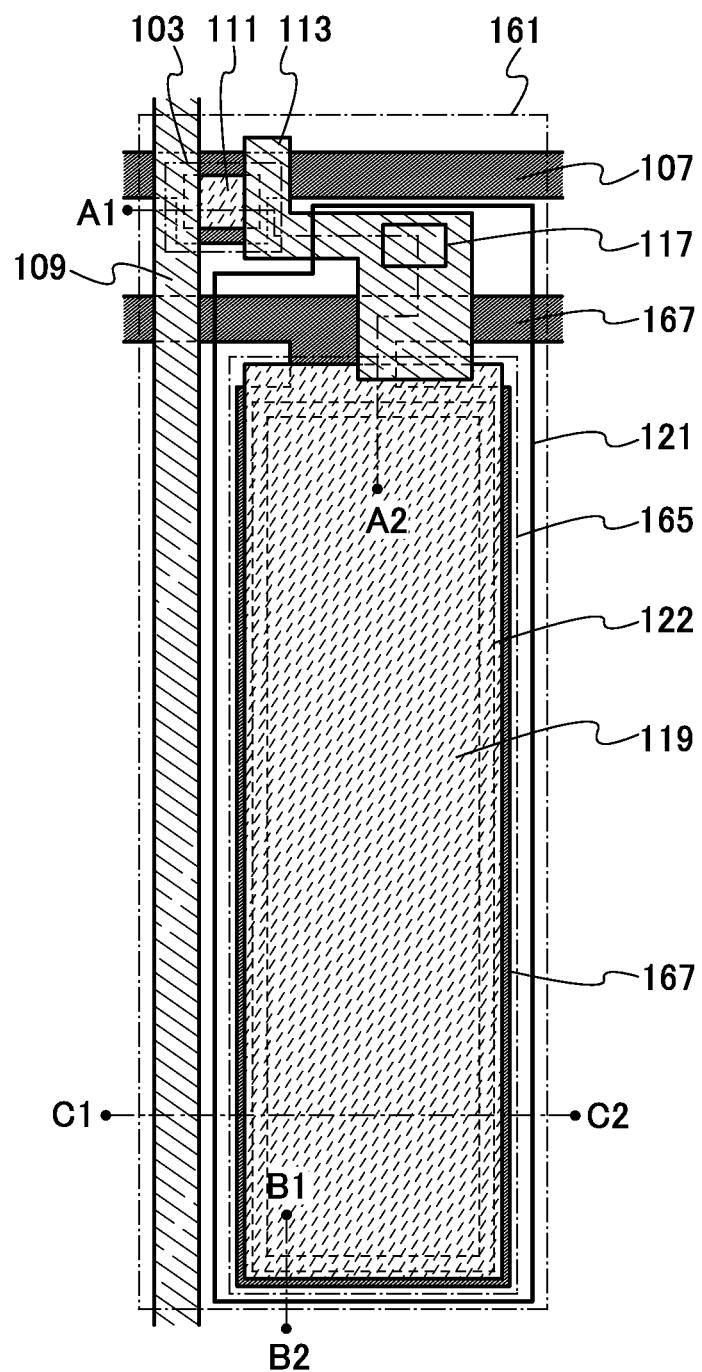
FIG. 7 is a top view illustrating a semiconductor device of one embodiment of the present invention.
Figure 8:
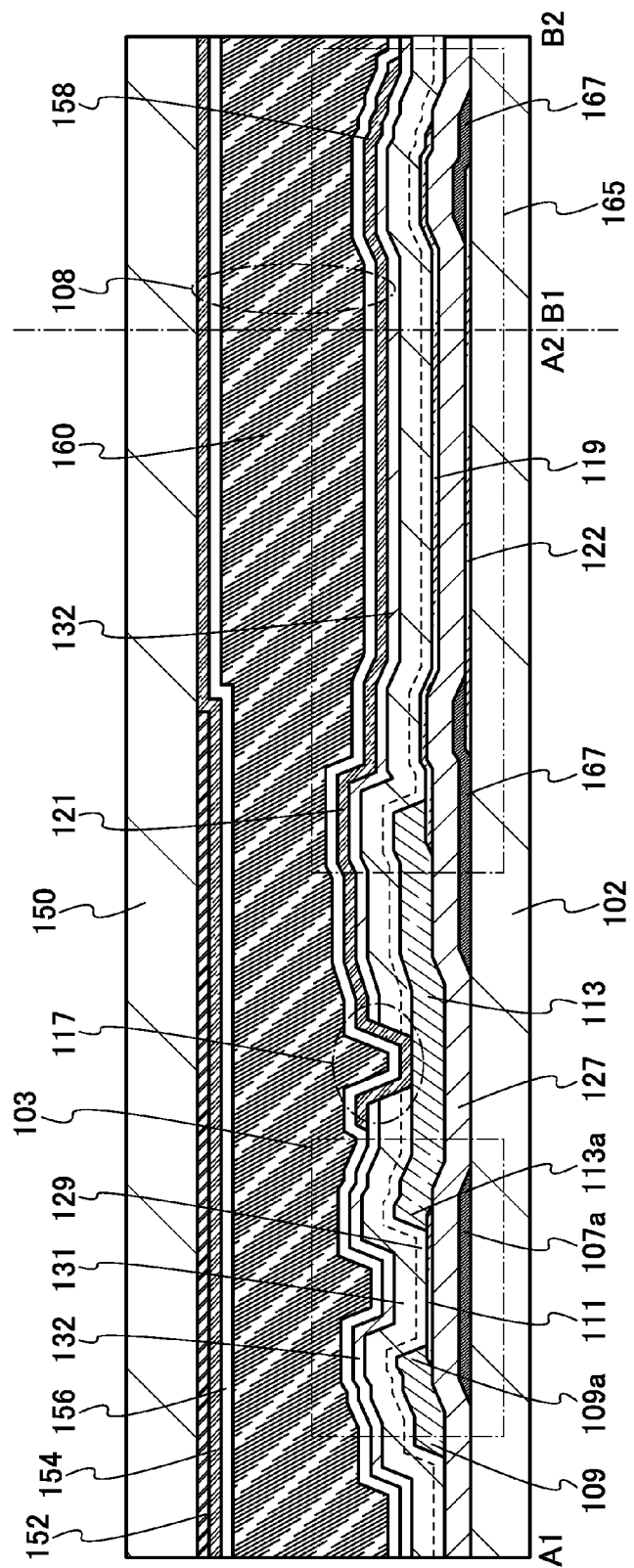
FIG. 8 is a cross-sectional view illustrating a semiconductor device of one embodiment of the present invention.
Figure 9:
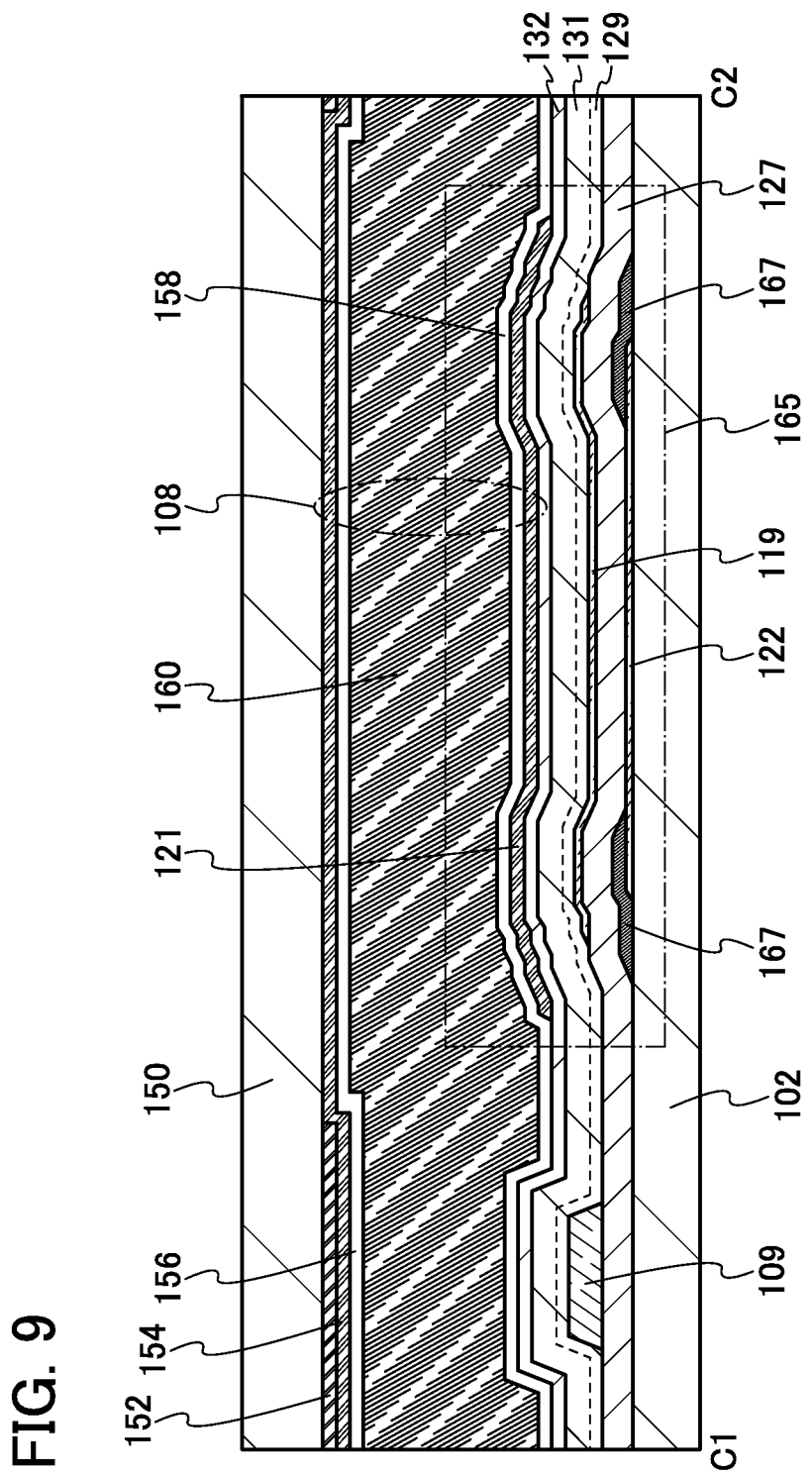
FIG. 9 is a cross-sectional view illustrating a semiconductor device of one embodiment of the present invention.

A specific example of the structure will be described with reference to FIG. 7, FIG. 8, and FIG. 9. Note that only portions different from those in FIG. 2 and FIG. 3 are described here. FIG. 7 is a top view of a pixel 161 in this structure, and FIG. 8 is a cross-sectional view taken along dashed-dotted lines A1-A2 and B1-B2 in FIG. 7. FIG. 9 is a cross-sectional view taken along dashed-dotted line C1-C2 in FIG. 7.

In the pixel 161 in this structure, a capacitor line 167 is provided in contact with the electrode 122 along the outer periphery thereof (see FIG. 7). The capacitor line 167 is formed in the same formation process as the scan line 107 functioning as the gate electrode of the transistor 103 and thus may have a light-blocking property; for this reason, the capacitor line 167 is preferably formed into a loop shape. The structure of the pixel 161 in FIG. 7 is similar to that in FIG. 2, except for the capacitor line 167.

As shown in FIG. 8 and FIG. 9, in the pixel 161 in this structure, the capacitor line 167 is provided so as to cover an end portion of the electrode 122 of a capacitor 165. With such a structure, contact resistance between the electrode 122 and the capacitor line 167 is reduced, so that charge can be efficiently supplied to the capacitor 165.

In the structure illustrated in FIG. 7, FIG. 8, and FIG. 9, the capacitor line 167 is formed into a loop shape; however, a conductive film formed in the same formation process as the capacitor line 167 may be provided in contact with the outer periphery of the electrode 122 so as to be separate from the capacitor line 167.

Modification Example 3

Figure 10:
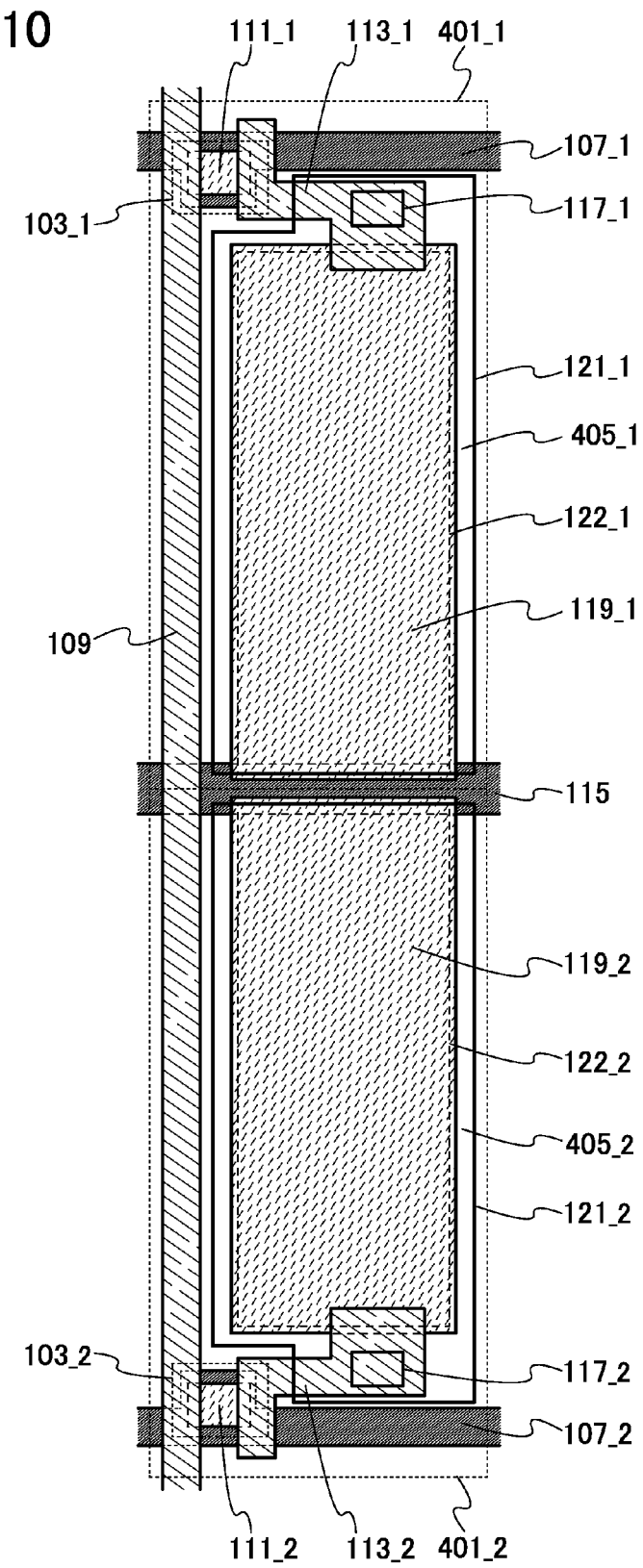
FIG. 10 is a top view illustrating a semiconductor device of one embodiment of the present invention.

In the semiconductor device of one embodiment of the present invention, the structure of the capacitor line can be changed as appropriate. FIG. 10 illustrates a structure in which the capacitor line is shared by adjacent pixels.

FIG. 10 is a top view of pixels 401_1 and 401_2 adjacent to each other in the direction in which the signal line 109 extends. The pixels 401_1 and 401_2 are different from the pixel 101 illustrated in FIG. 2 in the plan structure of the capacitor line 115.

Scan lines 107_1 and 107_2 illustrated in FIG. 10 are provided so as to extend in parallel to each other in the direction perpendicular to or substantially perpendicular to the signal line 109. A capacitor line 115 is provided between the scan lines 107_1 and 107_2 so as to be parallel to the scan lines 107_1 and 107_2. The capacitor line 115 is connected to a capacitor 405_1 provided in the pixel 401_1 and a capacitor 405_2 provided in the pixel 401_2. Top surface shape and the positions of components of the pixel 401_1 and those of the pixel 401_2 are symmetric with respect to the capacitor line 115.

The pixel 401_1 is provided with a transistor 103_1 and the capacitor 405_1 connected to the transistor 103_1.

The transistor 103_1 is provided in a region where the scan line 107_1 and the signal line 109 cross each other. The transistor 103_1 includes at least a semiconductor film 111_1 including a channel formation region, a gate electrode, a gate insulating film (not illustrated in FIG. 10), a source electrode, and a drain electrode. A portion of the scan line 107_1 which overlaps with the semiconductor film 111_1 functions as the gate electrode of the transistor 103_1. A portion of the signal line 109 which overlaps with the semiconductor film 111_1 functions as the source electrode of the transistor 103_1. A portion of a conductive film 113_1 which overlaps with the semiconductor film 111_1 functions as the drain electrode of the transistor 103_1. The conductive film 113_1 and a pixel electrode 121_1 are connected to each other through an opening 117_1.

The capacitor 405_1 is electrically connected to the capacitor line 115. The capacitor 405_1 includes a semiconductor film 119_1 formed using a light-transmitting oxide semiconductor, a light-transmitting electrode 122_1, and, as a dielectric film, part of a layer used for forming the gate insulating film of the transistor 103_1 (not illustrated in FIG. 10). That is, the capacitor 405_1 transmits light.

The pixel 401_2 is provided with a transistor 103_2 and the capacitor 405_2 connected to the transistor 1032.

The transistor 103_2 is provided in a region where the scan line 107_2 and the signal line 109 cross each other. The transistor 103_2 includes at least a semiconductor film 111_2 including a channel formation region, a gate electrode, a gate insulating film (not illustrated in FIG. 10), a source electrode, and a drain electrode. A portion of the scan line 107_2 which overlaps with the semiconductor film 111_2 functions as the gate electrode of the transistor 103_2. A portion of the signal line 109 which overlaps with the semiconductor film 111_2 functions as the source electrode of the transistor 103_2. A portion of a conductive film 113_2 which overlaps with the semiconductor film 111_2 functions as the drain electrode of the transistor 103_2. The conductive film 113_2 and a pixel electrode 121_2 are connected to each other through an opening 117_2.

Similarly to the capacitor 405_1, the capacitor 405_2 is electrically connected to the capacitor line 115. The capacitor 405_2 includes a semiconductor film 119_2 formed using a light-transmitting oxide semiconductor, a light-transmitting electrode 122_2, and, as a dielectric film, part of a layer used for forming the gate insulating film of the transistor 103_2 (not illustrated in FIG. 10). That is, the capacitor 405_2 transmits light.

Cross-sectional structures of the transistors 103_1 and 103_2 and the capacitors 405_1 and 405_2 are similar to those of the transistor 103 and the capacitor 105 illustrated in FIG. 3 and thus descriptions thereof are omitted here.

In a structure seen from above, a capacitor line is provided between adjacent two pixels so that capacitors included in the pixels are connected to the capacitor line, whereby the number of capacitor lines can be reduced. As a result, the aperture ratio of the pixel can be high as compared with the case of a structure where each pixel is provided with a capacitor line.

The electrode 122_1 can be connected to an electrode 1222 so that the electrodes are formed as one electrode. Alternatively, the capacitor line 115 may be omitted and the electrode 122_1 and the electrode 122_2 may be extended along the scan line 107_1 and the scan line 1072.

As described above, the use of the semiconductor film formed in the same formation process as the semiconductor film of the transistor, for one electrode of the capacitor, allows fabrication of a semiconductor device including the capacitor whose charge capacity is increased while the aperture ratio is improved. Further, with the improved aperture ratio, the semiconductor device can have excellent display quality.

Further, oxygen vacancies and impurities such as hydrogen and nitrogen in the oxide semiconductor film, which is a semiconductor film of the transistor, are reduced, so that the semiconductor device of one embodiment of the present invention has favorable electrical characteristics.

Note that the structure and the like described in this embodiment can be used as appropriate in combination with any of the structures and the like in the other embodiments.

Embodiment 2

The transistor 103 and the transistor 153 described in the above embodiment are each a channel-etched transistor in which the channel formation region of the semiconductor film 111 is exposed to an etchant or an etching gas used for forming the signal line 109 and the conductive film 113. Note that a structure which can be applied to the transistor 103 and the transistor 153 is not limited to the channel-etched structure. In this embodiment, examples of a transistor structure which can be applied to the transistor 103 and the transistor 153 are described with reference to FIGS. 11A to 11C.

Figure 11A:
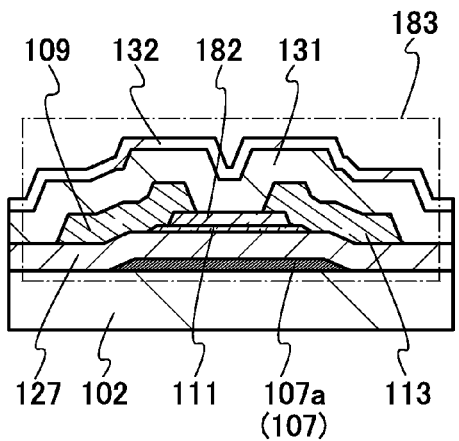
FIGS. 11A to 11C are cross-sectional views each illustrating a semiconductor device of one embodiment of the present invention.

A transistor 183 in FIG. 11A is a channel-protective transistor in which a channel protective film 182 is formed over the semiconductor film 111, and the signal line 109 and the conductive film 113 are formed so as to overlap with part of the channel protective film 182. The channel protective film 182 can prevent the channel formation region of the semiconductor film 111 from being exposed to an etchant or an etching gas used for forming the signal line 109 and the conductive film 113. Thus, damage to the semiconductor film 111 in forming the signal line 109 and the conductive film 113 can be reduced, though a step of forming the channel protective film 182 is added.

Owing to the channel protective film 182, leakage current between the source electrode and the drain electrode of the transistor can be reduced. Further, the transistor can have favorable electrical characteristics.

The channel protective film 182 can be formed using a material similar to that of the insulating film 129. In the transistor 183, the step of forming the insulating film 129 is skipped by forming the channel protective film 182 using a material similar to that of the insulating film 129.

Figure 11B:
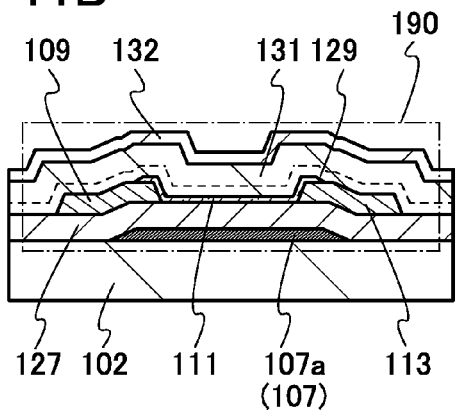

A transistor 190 in FIG. 11B has the following structure: the signal line 109 and the conductive film 113 are formed over the gate insulating film 127, and the semiconductor film 111 is formed so as to be in contact with part of the gate insulating film 127, part of the signal line 109, and part of the conductive film 113 and to overlap with the scan line 107. Since the semiconductor film 111 is formed after the signal line 109 and the conductive film 113 are formed, the semiconductor film 111 is not exposed to an etchant or an etching gas used for forming the signal line 109 and the conductive film 113.

In the case where the structure of the transistor 190 is applied to the transistor 103 or the transistor 153, the semiconductor film 119 is formed over the conductive film 113.

Figure 11C:
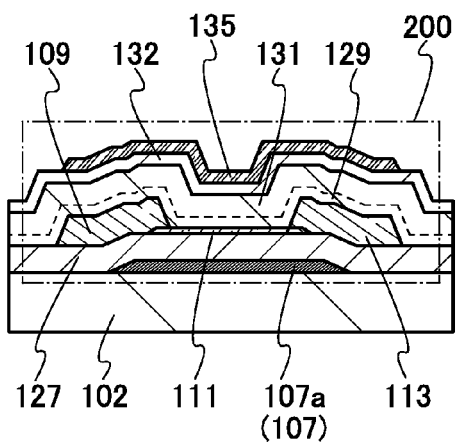

In a transistor 200 in FIG. 11C, a conductive film 135 is formed over the insulating film 132 of the transistor 103 or the transistor 153 in the above embodiment. The conductive film 135 is formed so as to overlap with at least the channel formation region of the semiconductor film 111. The potential of the conductive film 135 can be a common potential, a GND potential, or an arbitrary potential, or the conductive film 135 can be in a floating state. With the conductive film 135, the amount of change of the threshold voltage of the transistor 200 between before and after a reliability test (e.g., Bias Temperature (BT) stress test) can be further reduced. With the conductive film 135, variation in the electrical characteristics of the transistor due to an influence of an external electric field such as static electricity can be prevented, leading to improvement of the reliability of the transistor.

The conductive film 135 can function as a back gate electrode. A back gate electrode is positioned so that a channel formation region of a semiconductor layer is interposed between a gate electrode and the back gate electrode. The back gate electrode is formed using a conductive layer and can function in a manner similar to that of the gate electrode. By controlling the potential of the back gate electrode, the threshold voltage of a transistor can be controlled. Alternatively, the conductive film 135 and the scan line 107 (gate electrode) may be connected to each other to have the same potential so that the conductive film 135 functions as a second gate electrode.

The conductive film 135 can be formed using a material and a method similar to those of the scan line 107, the signal line 109, the pixel electrode 121, or the like.

The structures of the transistor 183, the transistor 190, and the transistor 200 described in this embodiment and the transistor 103 and the transistor 153 described in the above embodiment can be applied not only to a transistor included in the pixel 101 but also to a transistor included in the scan line driver circuit 104 or the signal line driver circuit 106.

Note that the structure and the like described in this embodiment can be used as appropriate in combination with any of the structures and the like in the other embodiments.

Embodiment 3

In this embodiment, one embodiment of an oxide semiconductor film which can be applied to the transistor and the capacitor described in any of the above embodiments will be described.

An oxide semiconductor film is classified roughly into a single-crystal oxide semiconductor film and a non-single-crystal oxide semiconductor film. The non-single-crystal oxide semiconductor film includes any of an amorphous oxide semiconductor film, a microcrystalline oxide semiconductor film, a polycrystalline oxide semiconductor film, a c-axis aligned crystalline oxide semiconductor (CAAC-OS) film, and the like.

The amorphous oxide semiconductor film has disordered atomic arrangement and no crystalline component. A typical example thereof is an oxide semiconductor film in which no crystal part exists even in a microscopic region, and the whole of the film is amorphous.

The microcrystalline oxide semiconductor film includes a microcrystal (also referred to as nanocrystal) with a size greater than or equal to 1 nm and less than 10 nm, for example. Thus, the microcrystalline oxide semiconductor film has a higher degree of atomic order than the amorphous oxide semiconductor film. Hence, the density of defect states of the microcrystalline oxide semiconductor film is lower than that of the amorphous oxide semiconductor film.

The CAAC-OS film is one of oxide semiconductor films including a plurality of crystal parts, and most of the crystal parts each fit inside a cube whose one side is less than 100 nm. Thus, there is a case where a crystal part included in the CAAC-OS film fits inside a cube whose one side is less than 10 nm, less than 5 nm, or less than 3 nm. The density of defect states of the CAAC-OS film is lower than that of the microcrystalline oxide semiconductor film. The CAAC-OS film is described in detail below.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

From the results of the cross-sectional TEM image and the plan TEM image, alignment is found in the crystal parts in the CAAC-OS film.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle ($2\theta$) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when $2\theta$ is around 56°. This peak is derived from the (110) plane of the $InGaZnO_4$ crystal. Here, analysis ($\phi$ scan) is performed under conditions where the sample is rotated around a normal vector of a sample surface as an axis ($\phi$ axis) with $2\theta$ fixed at around 56°. In the case where the sample is a single-crystal oxide semiconductor film of $InGaZnO_4$, six peaks appear. The six peaks are derived from crystal planes equivalent to the (110) plane. On the other hand, in the case of a CAAC-OS film, a peak is not clearly observed even when $\phi$ scan is performed with $2\theta$ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned with a direction parallel to a normal vector of a formation surface or a normal vector of a top surface. Thus, for example, in the case where a shape of the CAAC-OS film is changed by etching or the like, the c-axis might not be necessarily parallel to a normal vector of a formation surface or a normal vector of a top surface of the CAAC-OS film.

Further, the degree of crystallinity in the CAAC-OS film is not necessarily uniform. For example, in the case where crystal growth leading to the CAAC-OS film occurs from the vicinity of the top surface of the film, the degree of the crystallinity in the vicinity of the top surface is higher than that in the vicinity of the formation surface in some cases. Further, when an impurity is added to the CAAC-OS film, the crystallinity in a region to which the impurity is added is changed, and the degree of crystallinity in the CAAC-OS film varies depending on regions.

Note that when the CAAC-OS film with an $InGaZnO_4$ crystal is analyzed by an out-of-plane method, a peak of $2\theta$ may also be observed at around 36°, in addition to the peak of $2\theta$ at around 31°. The peak of $2\theta$ at around 36° indicates that a crystal having no c-axis alignment is included in part of the CAAC-OS film. It is preferable that in the CAAC-OS film, a peak of $2\theta$ appear at around 31° and a peak of $2\theta$ do not appear at around 36°.

Note that an oxide semiconductor film may be a stacked film including two or more films of an amorphous oxide semiconductor film, a microcrystalline oxide semiconductor film, and a CAAC-OS film, for example.

There are three methods for forming a CAAC-OS film.

The first method is to form an oxide semiconductor film at a temperature higher than or equal to 100° C. and lower than or equal to 450° C. to form, in the oxide semiconductor film, crystal parts in which the c-axes are aligned in the direction parallel to a normal vector of a surface where the oxide semiconductor film is formed or a normal vector of a surface of the oxide semiconductor film.

The second method is to form an oxide semiconductor film with a small thickness and then heat it at a temperature higher than or equal to 200° C. and lower than or equal to 700° C. to form, in the oxide semiconductor film, crystal parts in which the c-axes are aligned in the direction parallel to a normal vector of the surface where the oxide semiconductor film is formed or to a normal vector of the top surface of the oxide semiconductor film.

The third method is to form a first oxide semiconductor film with a small thickness, then heat it at a temperature higher than or equal to 200° C. and lower than or equal to 700° C., and form a second oxide semiconductor film to form, in the second oxide semiconductor film, crystal parts in which the c-axes are aligned in the direction parallel to a normal vector of the surface where the second oxide semiconductor film is formed or to a normal vector of the top surface of the second oxide semiconductor film.

In a transistor using the CAAC-OS film as the oxide semiconductor film, change in electrical characteristics due to irradiation with visible light or ultraviolet light is small. Thus, the transistor using the CAAC-OS film as the oxide semiconductor film has high reliability.

Further, it is preferable that the CAAC-OS film be formed by a sputtering method using a polycrystalline oxide semiconductor sputtering target. When ions collide with the sputtering target, a crystal region included in the sputtering target may be separated from the target along an a-b plane; in other words, a sputtered particle having a plane parallel to an a-b plane (flat-plate-like sputtered particle or pellet-like sputtered particle) may flake off from the sputtering target. In that case, the flat-plate-like sputtered particle or the pellet-like sputtered particle reaches a surface where the CAAC-OS film is formed while maintaining its crystal state, whereby the CAAC-OS film can be deposited.

For the deposition of the CAAC-OS film, the following conditions are preferably used.

By reducing the amount of impurities entering the CAAC-OS film during the deposition, the crystal state can be prevented from being broken by the impurities. For example, the concentration of impurities (e.g., hydrogen, water, carbon dioxide, or nitrogen) which exist in a deposition chamber may be reduced. Furthermore, the concentration of impurities in a deposition gas may be reduced. Specifically, a deposition gas whose dew point is −80° C. or lower, preferably −100° C. or lower is used.

By increasing the heating temperature of the surface where the CAAC-OS film is formed (for example, the substrate heating temperature) during the deposition, migration of a sputtered particle is likely to occur after the sputtered particle reaches the surface where the CAAC-OS film is formed. Specifically, the temperature of the surface where the CAAC-OS film is formed during the deposition is higher than or equal to 100° C. and lower than or equal to 740° C., preferably higher than or equal to 150° C. and lower than or equal to 500° C. By increasing the temperature of the surface where the CAAC-OS film is formed during the deposition, when the flat-plate-like or pellet-like sputtered particle reaches the surface where the CAAC-OS film is formed, migration occurs on the surface, so that flat planes of the sputtered particles are attached to the surface.

Furthermore, it is preferable that the proportion of oxygen in the deposition gas be increased and the power be optimized in order to reduce plasma damage at the deposition. The proportion of oxygen in the deposition gas is 30 vol % or higher, preferably 100 vol %.

As an example of the sputtering target, an In—Ga—Zn—O compound target is described below.

A polycrystalline In—Ga—Zn-based metal oxide target is made by mixing $InO_x$ powder, $GaO_y$ powder, and $ZnO_z$ powder in a predetermined molar ratio, applying pressure, and performing heat treatment at a temperature higher than or equal to 1000° C. and lower than or equal to 1500° C. This pressure treatment may be performed while cooling is performed or may be performed while heating is performed. Note that X, Y, and Z are each a given positive number. Here, the predetermined molar ratio of $InO_x$ powder to $GaO_y$ powder and $ZnO_z$ powder is, for example, 2:2:1, 8:4:3, 3:1:1, 1:1:1, 4:2:3, or 3:1:2. The kinds of powder and the molar ratio for mixing powder may be determined as appropriate depending on the desired sputtering target.

Further, the oxide semiconductor film may have a structure in which a plurality of oxide semiconductor films is stacked. For example, the oxide semiconductor film may have a stacked-layer structure of a first oxide semiconductor film and a second oxide semiconductor film which are formed using metal oxides with different atomic ratios. For example, the first oxide semiconductor film may be formed using one of an oxide containing two kinds of metals, an oxide containing three kinds of metals, and an oxide containing four kinds of metals, and the second oxide semiconductor film may be formed using one of the above which is different from the one used for the first oxide semiconductor film.

Alternatively, the oxide semiconductor film may have a two-layer structure where the constituent elements of the first oxide semiconductor film and the second oxide semiconductor film are the same while the atomic ratios of the constituent elements of the first oxide semiconductor film and the second oxide semiconductor film are different. For example, the first oxide semiconductor film may contain In, Ga, and Zn at an atomic ratio of 3:1:2, and the second oxide semiconductor film may contain In, Ga, and Zn at an atomic ratio of 1:1:1. Alternatively, the first oxide semiconductor film may contain In, Ga, and Zn at an atomic ratio of 2:1:3, and the second oxide semiconductor film may contain In, Ga, and Zn at an atomic ratio of 1:3:2. Note that a proportion of each atom in the atomic ratio of the oxide semiconductor film varies within a range of ±20% as an error.

In this case, in one of the first oxide semiconductor film and the second oxide semiconductor film, which is closer to the gate electrode (the oxide semiconductor film on the channel side), the atomic ratio of In to Ga is preferably as follows: In≥Ga. In the other oxide semiconductor film, which is farther from the gate electrode (i.e., the oxide semiconductor film on the back channel side), the atomic ratio of In to Ga is preferably as follows: In<Ga. With a stacked-layer structure of these oxide semiconductor films, a transistor having high field-effect mobility can be formed. On the other hand, the atomic ratio of In to Ga in the oxide semiconductor film closer to the gate electrode (the oxide semiconductor film on the channel side) satisfies the relation In<Ga and the atomic ratio of In to Ga in the oxide semiconductor film on the back channel side satisfies the relation In≥Ga, whereby the amount of change of the threshold voltage of a transistor due to change over time or a reliability test can be reduced.

The first oxide semiconductor film containing In, Ga, and Zn at an atomic ratio of 1:3:2 can be formed by a sputtering method using an oxide target with an atomic ratio of 1:3:2 under the conditions where the substrate temperature is room temperature and a sputtering gas is argon or a mixed gas of argon and oxygen. The second oxide semiconductor film containing In, Ga, and Zn at an atomic ratio of 3:1:2 can be formed by a sputtering method using an oxide target with an atomic ratio of 3:1:2 in a manner similar to that of the first oxide semiconductor film.

Alternatively, the oxide semiconductor film may have a three-layer structure of a first oxide semiconductor film, a second oxide semiconductor film, and a third oxide semiconductor film, in which the constituent elements thereof are the same and the atomic ratios of the constituent elements of the first oxide semiconductor film, the second oxide semiconductor film, and the third oxide semiconductor film are different. The case where the oxide semiconductor film has a three-layer structure is described with reference to FIG. 12.

Figure 12:
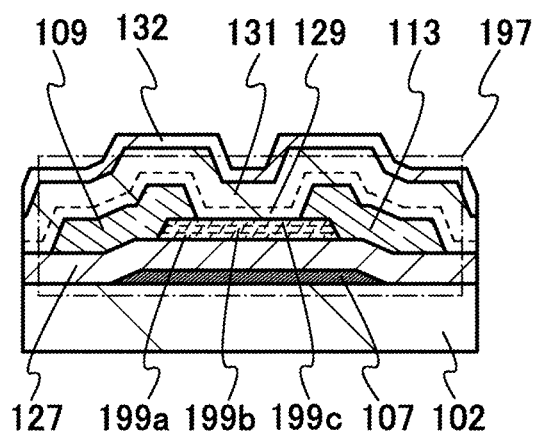
FIG. 12 is a cross-sectional view illustrating a semiconductor device of one embodiment of the present invention.

In a transistor illustrated in FIG. 12, a first oxide semiconductor film 199a, a second oxide semiconductor film 199b, and a third oxide semiconductor film 199c are stacked in this order from the gate insulating film 127 side. As a material of each of the first and third oxide semiconductor films 199a and 199c, a material represented by $InM1_xZn_yO_z$ (x≥1, y>1, z>0, M1=Ga, Hf, or the like) is used. Note that in the case where a material of each of the first and third oxide semiconductor films 199a and 199c contains Ga, a material containing a high proportion of Ga, specifically, a material which can be represented by $InM1_xZn_yO_z$ where x is larger than 10 is unsuitable because powder might be generated in deposition.

As a material of the second oxide semiconductor film 199b, a material which can be represented by $InM2_xZn_yO_z$ (x≥1, y≥x, z>0, M2=Ga, Sn, or the like) is used.

Materials of the first to third oxide semiconductor films 199a to 199c are appropriately selected so that a well structure is formed in which the bottom of the conduction band in the second oxide semiconductor film 199b is deeper from the vacuum level than the bottoms of the conduction band in the first and third oxide semiconductor films 199a and 199c.

Note that silicon and carbon, which are Group 14 elements, are donor supply sources in an oxide semiconductor film; thus, silicon or carbon contained in an oxide semiconductor film makes the oxide semiconductor film n-type. Thus, the concentration of silicon contained in an oxide semiconductor film and the concentration of carbon contained in an oxide semiconductor film are each less than or equal to $3\times10^{18}/cm^3$, preferably less than or equal to $3\times10^{17}/cm^3$. It is particularly preferable to employ a structure where the first and third oxide semiconductor films 199a and 199c sandwich or surround the second oxide semiconductor film 199b serving as a carrier path so that a large number of Group 14 elements do not enter the second oxide semiconductor film 199b. That is, the first and third oxide semiconductor films 199a and 199c can also be called barrier films which prevent Group 14 elements such as silicon and carbon from entering the second oxide semiconductor film 199b.

For example, the first oxide semiconductor film 199a may contain In, Ga, and Zn at an atomic ratio of 1:3:2, the second oxide semiconductor film 199b may contain In, Ga, and Zn at an atomic ratio of 3:1:2, and the third oxide semiconductor film 199c may contain In, Ga, and Zn at an atomic ratio of 1:1:1. Note that the third oxide semiconductor film 199c can be formed by a sputtering method using an oxide target containing In, Ga, and Zn at an atomic ratio of 1:1:1.

Alternatively, a three-layer structure may be employed in which the first oxide semiconductor film 199a contains In, Ga, and Zn at an atomic ratio of 1:3:2, the second oxide semiconductor film 199b contains In, Ga, and Zn at an atomic ratio of 1:1:1 or 1:3:2, and the third oxide semiconductor film 199c contains In, Ga, and Zn at an atomic ratio of 1:3:2.

Since the constituent elements of the first to third oxide semiconductor films 199a to 199c are the same, the second oxide semiconductor film 199b has fewer defect states (trap levels) at the interface with the first oxide semiconductor film 199a. Specifically, the defect states (trap levels) are fewer than those at the interface between the gate insulating film 127 and the first oxide semiconductor film 199a. For this reason, when the oxide semiconductor films are stacked in the above manner, the amount of change of the threshold voltage of a transistor due to change over time or a reliability test can be reduced.

Further, when materials of the first to third oxide semiconductor films 199a to 199c are appropriately selected so that a well structure is formed in which the bottom of the conduction band in the second oxide semiconductor film 199b is deeper from the vacuum level than the bottoms of the conduction band in the first and third oxide semiconductor films 199a and 199c, the field-effect mobility of the transistor can be increased and the amount of change of the threshold voltage of the transistor due to change over time or a reliability test can be reduced.

Further, the first to third oxide semiconductor films 199a to 199c may be formed using oxide semiconductor films having different crystallinities. That is, the first to third oxide semiconductor films may be formed using a combination of any of a single crystal oxide semiconductor film, a polycrystalline oxide semiconductor film, an amorphous oxide semiconductor film, and a CAAC-OS film, as appropriate. When an amorphous oxide semiconductor film is used as any one of the first to third oxide semiconductor films 199a to 199c, internal stress or external stress of the oxide semiconductor film is relieved, variations in characteristics of the transistor are reduced, and the amount of change of the threshold voltage of the transistor due to change over time or a reliability test can be reduced.

At least the second oxide semiconductor film 199b, which can serve as a channel formation region, is preferably a CAAC-OS film. An oxide semiconductor film on the back channel side, in this embodiment, the third oxide semiconductor film 199c is preferably an amorphous oxide semiconductor film or a CAAC-OS film. With such a structure, the amount of change of the threshold voltage of a transistor due to change over time or a reliability test can be reduced.

Note that the structure and the like described in this embodiment can be used as appropriate in combination with any of the structures and the like in the other embodiments.

Embodiment 4

A semiconductor device (also referred to as a display device) having a display function can be fabricated using a transistor and a capacitor examples of which are described in the above embodiments. Moreover, some or all of driver circuits which include the transistor can be formed over a substrate where a pixel portion is formed, whereby a system-on-panel can be obtained. In this embodiment, examples of display devices using the transistor examples of which are shown in the above embodiments will be described with reference to FIGS. 13A to 13C, FIG. 14, and FIGS. 15A to 15C. FIG. 14 is a cross-sectional view illustrating a cross-sectional structure taken along dashed-dotted line M-N in FIG. 13B. Note that in FIG. 14, only part of the structure of the pixel portion is illustrated.

Figure 13A:
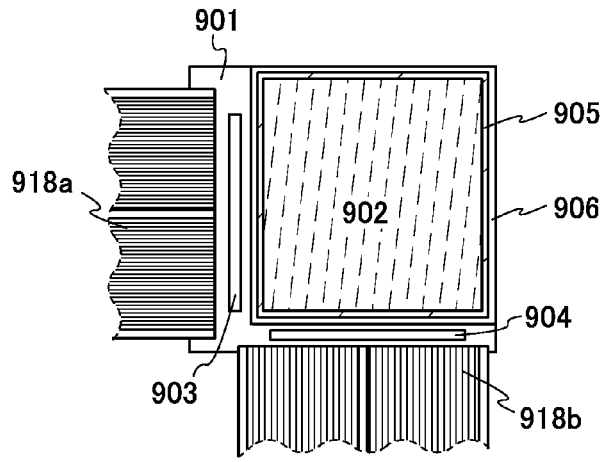
FIGS. 13A to 13C are top views each illustrating a semiconductor device of one embodiment of the present invention.
Figure 14:
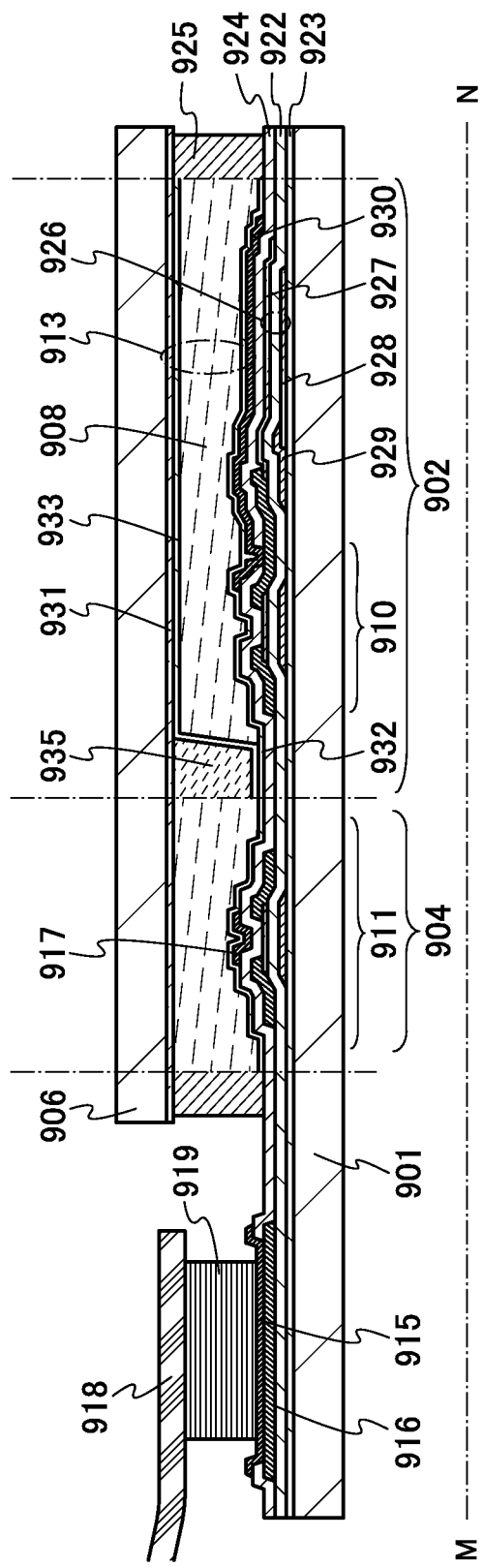
FIG. 14 is a cross-sectional view illustrating a semiconductor device of one embodiment of the present invention.

In FIG. 13A, a sealant 905 is provided so as to surround a pixel portion 902 provided over a first substrate 901, and the pixel portion 902 is sealed with a second substrate 906. In FIG. 13A, a signal line driver circuit 903 and a scan line driver circuit 904 are each formed using a single crystal semiconductor or a polycrystalline semiconductor over a substrate separately prepared, and mounted in a region different from the region surrounded by the sealant 905 over the first substrate 901. Further, various signals and potentials are supplied to the signal line driver circuit 903, the scan line driver circuit 904, and the pixel portion 902 from flexible printed circuits (FPCs) 918a and 918b.

Figure 13B:
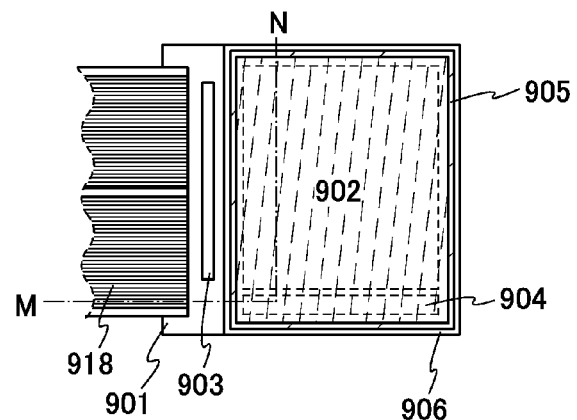
Figure 13C:
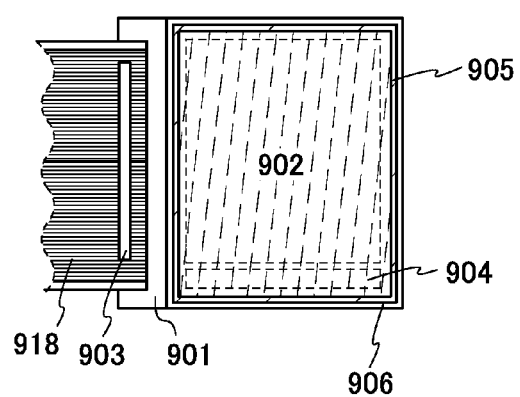

In FIGS. 13B and 13C, the sealant 905 is provided so as to surround the pixel portion 902 and the scan line driver circuit 904 which are provided over the first substrate 901. The second substrate 906 is provided over the pixel portion 902 and the scan line driver circuit 904. Thus, the pixel portion 902 and the scan line driver circuit 904 are sealed together with a display element by the first substrate 901, the sealant 905, and the second substrate 906. In FIGS. 13B and 13C, the signal line driver circuit 903 which is formed using a single crystal semiconductor or a polycrystalline semiconductor over a substrate separately prepared is mounted in a region different from the region surrounded by the sealant 905 over the first substrate 901. In FIGS. 13B and 13C, various signals and potentials are supplied to the signal line driver circuit 903, the scan line driver circuit 904, and the pixel portion 902 from an FPC 918.

Although FIGS. 13B and 13C each illustrate an example in which the signal line driver circuit 903 is formed separately and mounted on the first substrate 901, one embodiment of the present invention is not limited to this structure. The scan line driver circuit may be separately formed and then mounted, or only part of the signal line driver circuit or part of the scan line driver circuit may be separately formed and then mounted.

A connection method of a separately formed driver circuit is not particularly limited; a chip on glass (COG) method, a wire bonding method, a tape carrier package (TCP) method, or the like can be used. FIG. 13A illustrates an example in which the signal line driver circuit 903 and the scan line driver circuit 904 are mounted by a COG method. FIG. 13B illustrates an example in which the signal line driver circuit 903 is mounted by a COG method. FIG. 13C illustrates an example in which the signal line driver circuit 903 is mounted by a TCP method.

The display device includes in its category a panel in which a display element is sealed and a module in which an IC including a controller or the like is mounted on the panel.

A display device in this specification refers to an image display device, a display device, or a light source (including a lighting device). Further, the display device also includes the following modules in its category: a module to which a connector such as an FPC or a TCP is attached; a module having a TCP at the tip of which a printed wiring board is provided; and a module in which an integrated circuit (IC) is directly mounted on a display element by a COG method.

The pixel portion and the scan line driver circuit provided over the first substrate include a plurality of transistors and any of the transistors which are described in the above embodiments can be applied.

As the display element provided in the display device, a liquid crystal element (also referred to as a liquid crystal display element) or a light-emitting element (also referred to as a light-emitting display element) can be used. A light-emitting element includes, in its scope, an element whose luminance is controlled by current or voltage, and specifically includes an inorganic electroluminescent (EL) element, an organic EL element, and the like. Furthermore, a display medium whose contrast is changed by an electric effect, such as electronic ink, can be used. An example of a cross-sectional view of a liquid crystal display device using a liquid crystal element as the display element is illustrated in FIG. 14.

The liquid crystal display device illustrated in FIG. 14 is a vertical electric field mode liquid crystal display device; however, this structure can also be applied to a horizontal electric field mode liquid crystal display device. The liquid crystal display device illustrated in FIG. 14 includes a connection terminal electrode 915 and a terminal electrode 916. The connection terminal electrode 915 and the terminal electrode 916 are electrically connected to a terminal included in the FPC 918 through an anisotropic conductive member 919.

The connection terminal electrode 915 is formed using the same conductive film as a first electrode 930. The terminal electrode 916 is formed using the same conductive film as source and drain electrodes of transistors 910 and 911.

Further, the pixel portion 902 and the scan line driver circuit 904 which are provided over the first substrate 901 each include a plurality of transistors, and the transistor 910 included in the pixel portion 902 and the transistor 911 included in the scan line driver circuit 904 are illustrated as examples. An insulating film 924 corresponding to the insulating films 129, 131, and 132 described in Embodiment 1 is provided over the transistors 910 and 911. Note that an insulating film 923 serves as a base film.

A light-transmitting electrode 928 is formed over the insulating film 923 and is connected to a capacitor wiring 929. A gate insulating film 922 is formed over the electrode 928 and the capacitor wiring 929, and an oxide semiconductor film 927 is formed over the gate insulating film 922. The oxide semiconductor film 927 is connected to a drain electrode of the transistor 910.

In this embodiment, any of the transistors described in the above embodiments can be applied to the transistors 910 and 911. A capacitor 926 is formed using the electrode 928, the gate insulating film 922, and the oxide semiconductor film 927. The capacitor wiring 929 is formed using the same conductive film as a gate electrode of each of the transistors 910 and 911. Although a capacitor having a structure similar to that of the capacitor 105 described in Embodiment 1 is illustrated as the capacitor 926 here, any of the other capacitors may be used.

Moreover, an example in which a conductive film 917 is provided over the insulating film 924 so as to overlap with a channel formation region of the oxide semiconductor film of the transistor 911 for the driver circuit is shown. In this embodiment, the conductive film 917 is formed using the same conductive film as the first electrode 930. By providing the conductive film 917 so as to overlap with the channel formation region of the oxide semiconductor film, the amount of change of the threshold voltage of the transistor 911 between before and after a reliability test can be further reduced. The conductive film 917 may have the same potential as or a potential different from that of the gate electrode of the transistor 911. For example, the potential of the conductive film 917 may be GND or 0 V, or the conductive film 917 may be in a floating state. The conductive film 917 can function as a second gate electrode (back gate electrode). By controlling the potential of the conductive film 917, the threshold voltage of the transistor 911 can be controlled.

In addition, the conductive film 917 has a function of blocking an external electric field. In other words, the conductive film 917 has a function of preventing an external electric field (particularly, a function of preventing static electricity) from affecting the inside (a circuit portion including the transistor). Such a blocking function of the conductive film 917 can prevent variation in the electrical characteristics of the transistor due to an influence of an external electric field such as static electricity. Note that although the transistors included in the scan line driver circuit are illustrated in FIG. 14, in a manner similar to that of the transistor 911, a transistor included in the signal line driver circuit may have a structure in which a conductive film is provided over the insulating film 924 so as to overlap with a channel formation region of the oxide semiconductor film.

In the display panel, the transistor 910 included in the pixel portion 902 is electrically connected to a display element. There is no particular limitation on the kind of the display element as long as display can be performed, and various kinds of display elements can be used.

A liquid crystal element 913 serving as a display element includes the first electrode 930, a second electrode 931, and a liquid crystal layer 908. Note that an insulating film 932 and an insulating film 933 which serve as alignment films are provided so that the liquid crystal layer 908 is provided therebetween. The second electrode 931 is provided on the second substrate 906 side. The second electrode 931 overlaps with the first electrode 930 with the liquid crystal layer 908 provided therebetween.

The first electrode and the second electrode (each of which is also referred to as a pixel electrode, a common electrode, a counter electrode, or the like) for applying voltage to the display element may have light-transmitting properties or light-reflecting properties, which depends on the direction in which light is extracted, the position where the electrode is provided, and the pattern structure of the electrode.

The first electrode 930 and the second electrode 931 can be formed using a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added.

Alternatively, the first electrode 930 and the second electrode 931 can be formed using one or more materials selected from metals such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), and silver (Ag); an alloy of any of these metals; and a nitride of any of these metals.

A spacer 935 is a columnar spacer obtained by selective etching of an insulating film and is provided in order to control the distance between the first electrode 930 and the second electrode 931 (a cell gap). Alternatively, a spherical spacer may be used.

In the case where a liquid crystal element is used as the display element, a thermotropic liquid crystal, a low-molecular liquid crystal, a high-molecular liquid crystal, a polymer dispersed liquid crystal, a ferroelectric liquid crystal, an anti-ferroelectric liquid crystal, or the like can be used. Such a liquid crystal material exhibits a cholesteric phase, a smectic phase, a cubic phase, a chiral nematic phase, an isotropic phase, or the like depending on conditions.

Alternatively, a liquid crystal exhibiting a blue phase for which an alignment film is unnecessary may be used. A blue phase is one of liquid crystal phases, which is generated just before a cholesteric phase changes into an isotropic phase while temperature of a cholesteric liquid crystal is increased. Since the blue phase appears only in a narrow temperature range, a liquid crystal composition in which a chiral material is mixed is used for the liquid crystal layer in order to improve the temperature range.

The first substrate 901 and the second substrate 906 are fixed in place by a sealant 925. As the sealant 925, an organic resin such as a thermosetting resin or a photocurable resin can be used. The sealant 925 is in contact with the insulating film 924. Note that the sealant 925 corresponds to the sealant 905 in FIGS. 13A to 13C.

In the liquid crystal display device, a black matrix (a light-blocking film); an optical member (an optical substrate) such as a polarizing member, a retardation member, or an anti-reflection member; and the like are provided as appropriate. For example, circular polarization may be obtained by using a polarizing substrate and a retardation substrate. In addition, a backlight, a side light, or the like may be used as a light source.

Since the transistor is easily broken owing to static electricity or the like, a protective circuit for protecting the driver circuit is preferably provided. The protective circuit is preferably formed using a nonlinear element.

Figure 15A:
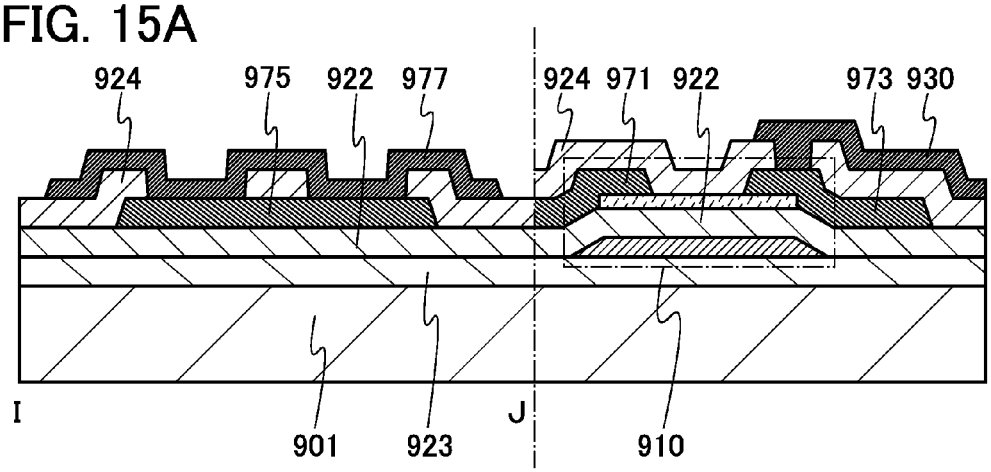
FIGS. 15A and 15B are a cross-sectional view and a top view illustrating a semiconductor device of one embodiment of the present invention.
Figure 15B:
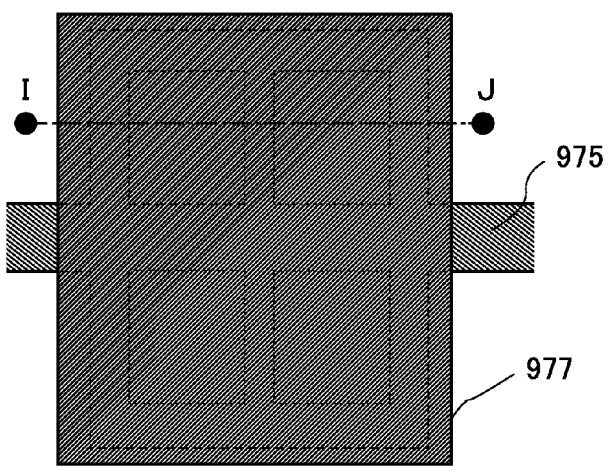
Figure 15C:
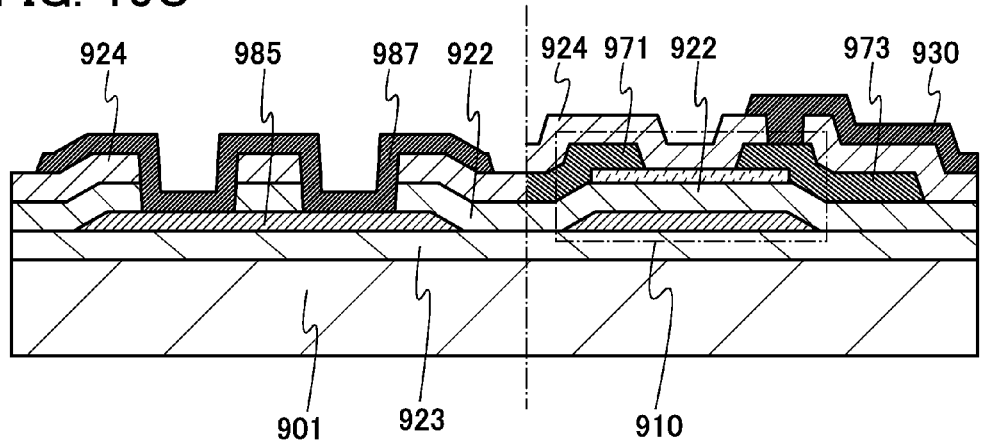
FIG. 15C is a cross-sectional view illustrating a semiconductor device of one embodiment of the present invention.

FIGS. 15A to 15C illustrate examples of the liquid crystal display device in FIG. 14 in which a common connection portion (pad portion) for being electrically connected to the second electrode 931 provided on the substrate 906 is formed over the substrate 901.

The common connection portion is provided in a position overlapping the sealant for bonding the substrate 901 and the substrate 906 and is electrically connected to the second electrode 931 through conductive particles contained in the sealant. Alternatively, the common connection portion is provided in a position not overlapping with the sealant (except for the pixel portion) and a paste including conductive particles is provided separately from the sealant so as to overlap with the common connection portion, whereby the common connection portion is electrically connected to the second electrode 931.

FIG. 15A is a cross-sectional view of the common connection portion taken along a line I-J in the top view in FIG. 15B.

A common potential line 975 is provided over the gate insulating film 922 and is formed using the same material and through the same steps as a source electrode 971 or a drain electrode 973 of the transistor 910 illustrated in FIG. 15A.

Further, the common potential line 975 is covered with the insulating film 924, and the insulating film 924 has a plurality of openings at a position overlapping with the common potential line 975. These openings are formed through the same steps as a contact hole which connects the first electrode 930 and one of the source electrode 971 and the drain electrode 973 of the transistor 910.

Further, the common potential line 975 is connected to a common electrode 977 through the openings. The common electrode 977 is provided over the insulating film 924 and is formed using the same material and through the same steps as the connection terminal electrode 915 and the first electrode 930 in the pixel portion.

In this manner, the common connection portion can be formed in the same process as the switching element in the pixel portion 902.

The common electrode 977 is in contact with the conductive particles contained in the sealant and is electrically connected to the second electrode 931 of the substrate 906.

Alternatively, as illustrated in FIG. 15C, a common potential line 985 may be formed using the same material and through the same steps as the gate electrode of the transistor 910.

In the common connection portion illustrated in FIG. 15C, the common potential line 985 is provided under the gate insulating film 922 and the insulating film 924; and the gate insulating film 922 and the insulating film 924 have a plurality of openings at a position overlapping with the common potential line 985. These openings are formed by etching the insulating film 924 through the same steps as a contact hole which connects the first electrode 930 and one of the source electrode 971 and the drain electrode 973 of the transistor 910, and then by further selectively etching the gate insulating film 922.

Further, the common potential line 985 is connected to a common electrode 987 through the openings. The common electrode 987 is provided over the insulating film 924 and is formed using the same material and through the same steps as the connection terminal electrode 915 and the first electrode 930 in the pixel portion.

As described above, the use of the transistor and capacitor described in any of the above embodiments allows fabrication of a semiconductor device including the capacitor whose charge capacity is increased while the aperture ratio is improved. Further, with the improved aperture ratio, the semiconductor device can have excellent display quality.

Further, oxygen vacancies and impurities such as hydrogen and nitrogen in the oxide semiconductor film, which is a semiconductor film of the transistor, are reduced, so that the semiconductor device of one embodiment of the present invention has favorable electrical characteristics.

Note that the structure and the like described in this embodiment can be used as appropriate in combination with any of the structures and the like in the other embodiments.

Embodiment 5

Figure 16A:
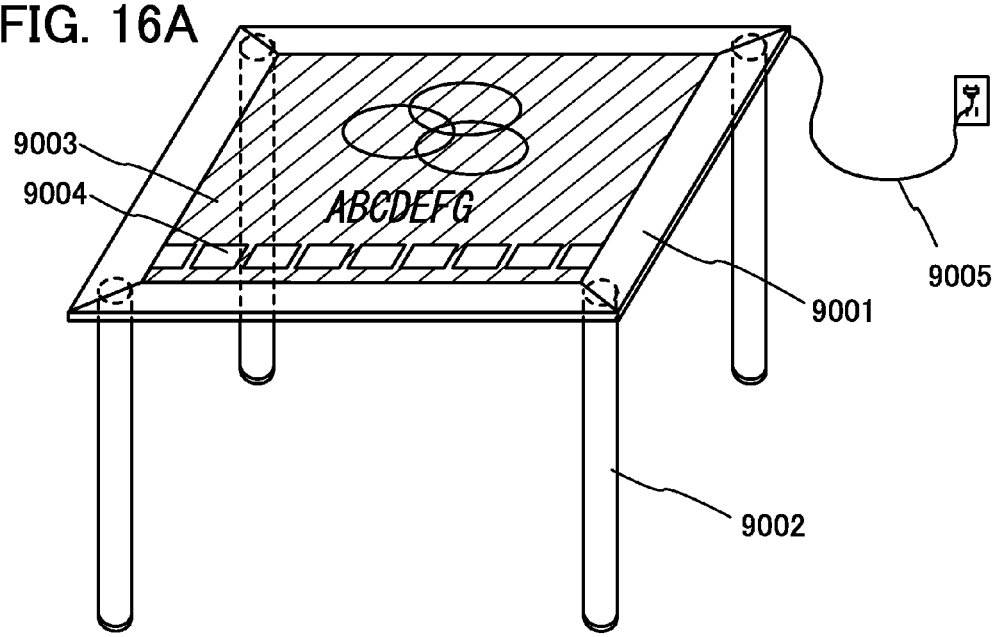
FIGS. 16A to 16C illustrate electronic devices in each of which a semiconductor device of one embodiment of the present invention is used.
Figure 16B:
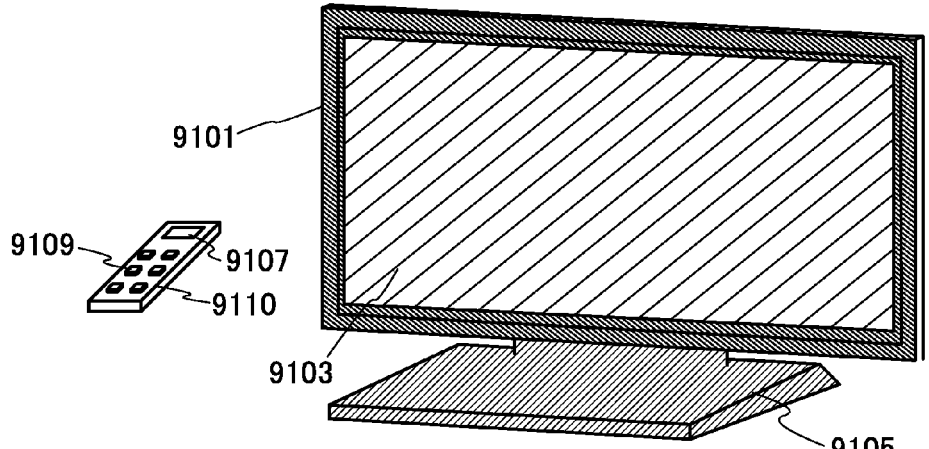
Figure 16C:
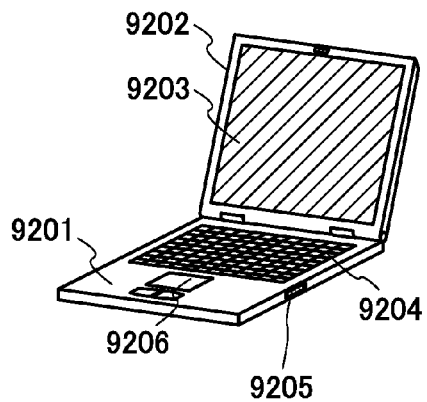

The semiconductor device of one embodiment of the present invention can be applied to any of a variety of electronic devices (including game machines). Examples of electronic devices are a television set (also referred to as a television or a television receiver), a monitor of a computer or the like, cameras such as a digital camera and a digital video camera, a digital photo frame, a mobile phone, a portable game machine, a portable information terminal, an audio reproducing device, game machines (e.g., a pachinko machine and a slot machine), and a game console. FIGS. 16A to 16C illustrate examples of these electronic devices.

FIG. 16A illustrates a table 9000 having a display portion. In the table 9000, a display portion 9003 is incorporated in a housing 9001 and an image can be displayed on the display portion 9003. Note that the housing 9001 is supported by four leg portions 9002. Further, a power cord 9005 for supplying power is provided for the housing 9001.

Any of the semiconductor devices described in the above embodiments can be used for the display portion 9003. Thus, the display portion 9003 can have higher display quality. Further, the display portion 9003 can have higher reliability.

The display portion 9003 has a touch-input function. When a user touches displayed buttons 9004 which are displayed on the display portion 9003 of the table 9000 with his/her fingers or the like, the user can carry out operation of the screen and input of information. Further, when the table may be made to communicate with home appliances or control the home appliances, the display portion 9003 may function as a control device which controls the home appliances by operation on the screen. For example, with the use of a semiconductor device having an image sensor function, the display portion 9003 can have a touch-input function.

Further, the screen of the display portion 9003 can be placed perpendicular to a floor with a hinge provided for the housing 9001; thus, the table 9000 can also be used as a television set. When a television set having a large screen is set in a small room, an open space is reduced; however, when a display portion is incorporated in a table, a space in the room can be efficiently used.

FIG. 16B illustrates a television set 9100. In the television set 9100, a display portion 9103 is incorporated in a housing 9101 and an image can be displayed on the display portion 9103. Note that the housing 9101 is supported by a stand 9105 here.

The television set 9100 can be operated with an operation switch of the housing 9101 or a separate remote controller 9110. Channels and volume can be controlled with an operation key 9109 of the remote controller 9110 so that an image displayed on the display portion 9103 can be controlled. Furthermore, the remote controller 9110 may be provided with a display portion 9107 for displaying data output from the remote controller 9110.

The television set 9100 illustrated in FIG. 16B is provided with a receiver, a modem, and the like. With the use of the receiver, the television set 9100 can receive general TV broadcasts. Moreover, when the television set 9100 is connected to a communication network with or without wires via the modem, one-way (from a sender to a receiver) or two-way (between a sender and a receiver or between receivers) information communication can be performed.

Any of the semiconductor devices described in the above embodiments can be used for the display portions 9103 and 9107. Thus, the television set can have higher display quality and higher reliability.

FIG. 16C illustrates a computer, which includes a main body 9201, a housing 9202, a display portion 9203, a keyboard 9204, an external connection port 9205, a pointing device 9206, and the like.

Any of the semiconductor devices described in the above embodiments can be used for the display portion 9203. Thus, the computer can have higher display quality and higher reliability.

Figure 17A:
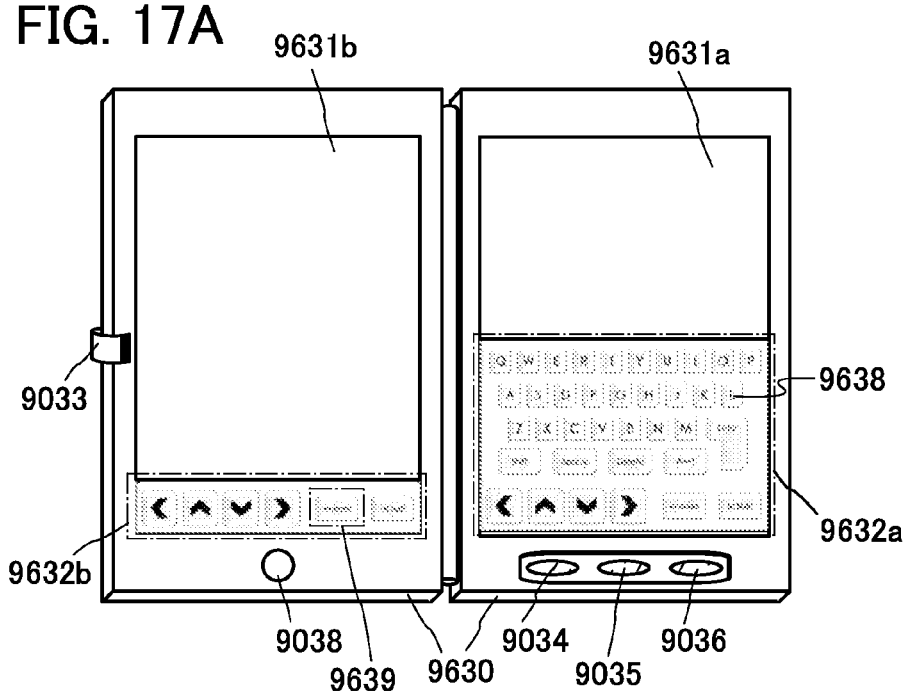
FIGS. 17A to 17C illustrate an electronic device in which a semiconductor device of one embodiment of the present invention is used.
Figure 17B:
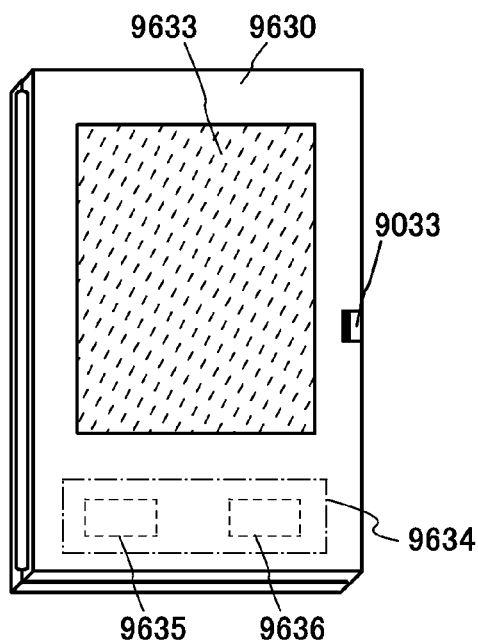

FIGS. 17A and 17B illustrate a foldable tablet terminal. In FIG. 17A, the tablet terminal is opened, and includes a housing 9630, a display portion 9631a, a display portion 9631b, a display-mode switching button 9034, a power button 9035, a power-saving-mode switching button 9036, a clip 9033, and an operation button 9038.

Any of the semiconductor devices described in the above embodiments can be used for the display portion 9631a and the display portion 9631b. Thus, the tablet terminal can have higher display quality and higher reliability.

Part of the display portion 9631a can be a touch panel region 9632a, and data can be input by touching operation keys 9638 that are displayed. Note that FIG. 17A shows, as an example, that half of the area of the display portion 9631a has only a display function and the other half of the area has a touch panel function. However, the structure of the display portion 9631a is not limited to this, and all the area of the display portion 9631a may have a touch panel function. For example, all the area of the display portion 9631a can display a keyboard and serve as a touch panel while the display portion 9631b can be used as a display screen.

In the display portion 9631b, as in the display portion 9631a, part of the display portion 9631b can be a touch panel region 9632b. When a finger, a stylus, or the like touches the place where a button 9639 for switching to keyboard display is displayed in the touch panel, a keyboard can be displayed on the display portion 9631b.

Touch input can be performed concurrently on the touch panel regions 9632a and 9632b.

The display-mode switching button 9034 allows switching between a portrait mode and a landscape mode, and between monochrome display and color display, for example. With the power-saving-mode switching button 9036, the luminance of display can be optimized in accordance with the amount of external light at the time when the tablet terminal is in use, which is detected with an optical sensor incorporated in the tablet terminal. The tablet terminal may include another detection device such as a sensor for detecting orientation (e.g., a gyroscope or an acceleration sensor) in addition to the optical sensor.

Although the display portion 9631a and the display portion 9631b have the same display area in FIG. 17A, one embodiment of the present invention is not limited to this example. The display portion 9631a and the display portion 9631b may have different areas or different display quality. For example, one of them may be a display panel that can display higher-definition images than the other.

FIG. 17B illustrates the tablet terminal folded, which includes the housing 9630, a solar battery 9633, and a charge and discharge control circuit 9634. Note that FIG. 17B illustrates an example in which the charge and discharge control circuit 9634 includes a battery 9635 and a DCDC converter 9636.

Since the tablet terminal is foldable, the housing 9630 can be closed when the tablet terminal is not used. Thus, the display portions 9631a and 9631b can be protected, whereby a tablet terminal with high endurance and high reliability for long-term use can be provided.

The tablet terminal illustrated in FIGS. 17A and 17B can also have a function of displaying various kinds of data (e.g., a still image, a moving image, and a text image), a function of displaying a calendar, a date, the time, or the like on the display portion, a touch-input function of operating or editing data displayed on the display portion by touch input, a function of controlling processing by various kinds of software (programs), and the like.

The solar battery 9633, which is attached to the surface of the tablet terminal, supplies electric power to a touch panel, a display portion, an image signal processor, and the like. Note that the solar battery 9633 can be provided on one or both surfaces of the housing 9630, so that the battery 9635 can be charged efficiently. When a lithium ion battery is used as the battery 9635, there is an advantage of downsizing or the like.

Figure 17C:
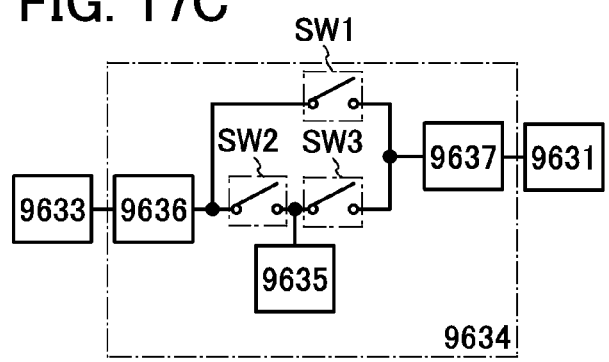

The structure and operation of the charge and discharge control circuit 9634 illustrated in FIG. 17B are described with reference to a block diagram of FIG. 17C. The solar battery 9633, the battery 9635, the DCDC converter 9636, a converter 9637, switches SW1, SW2, and SW3, and the display portion 9631 are illustrated in FIG. 17C, and the battery 9635, the DCDC converter 9636, the converter 9637, and the switches SW1 to SW3 correspond to the charge and discharge control circuit 9634 illustrated in FIG. 17B.

First, an example of operation in the case where power is generated by the solar battery 9633 using external light is described. The voltage of power generated by the solar battery is raised or lowered by the DCDC converter 9636 so that a voltage for charging the battery 9635 is obtained. When the display portion 9631 is operated with the power from the solar battery 9633, the switch SW1 is turned on and the voltage of the power is raised or lowered by the converter 9637 to a voltage needed for operating the display portion 9631. In addition, when display on the display portion 9631 is not performed, the switch SW1 is turned off and the switch SW2 is turned on so that charge of the battery 9635 may be performed.

Here, the solar battery 9633 is illustrated as an example of a power generation means; however, there is no particular limitation on a way of charging the battery 9635, and the battery 9635 may be charged with another power generation means such as a piezoelectric element or a thermoelectric conversion element (Peltier element). For example, the battery 9635 may be charged with a non-contact power transmission module which is capable of charging by transmitting and receiving power by wireless (without contact), or another charging means may be used in combination.

Note that the structure and the like described in this embodiment can be used as appropriate in combination with any of the structures and the like in the other embodiments.

This application is based on Japanese Patent Application serial No. 2012-178909 filed with Japan Patent Office on Aug. 10, 2012 and Japanese Patent Application serial No. 2013-049973 filed with Japan Patent Office on Mar. 13, 2013, the entire contents of which are hereby incorporated by reference.

What is claimed is:

1. A semiconductor device comprising:
   a transistor comprising:
   a gate electrode over and in contact with an insulating surface;
   an insulating layer over the gate electrode; and
   a semiconductor layer including a channel formation region over and in contact with the insulating layer, the semiconductor layer containing oxygen, indium, zinc and a metal other than indium and zinc; and
   a capacitor comprising:
   a first conductive layer over and in contact with the insulating surface;
   the insulating layer over the first conductive layer; and
   a second conductive layer over and in contact with the insulating layer, the second conductive layer containing oxygen, indium, zinc and the metal,
   wherein each of the semiconductor layer, the first conductive layer, the insulating layer and the second conductive layer is capable of transmitting light, and
   wherein the second conductive layer includes a region having a higher conductivity than the channel formation region of the semiconductor layer.

2. The semiconductor device according to claim 1, wherein the first conductive layer includes an oxide semiconductor.

3. The semiconductor device according to claim 1, wherein the first conductive layer contains one or more elements selected from boron, nitrogen, fluorine, aluminum, phosphorus, arsenic, indium, tin, antimony, and a rare gas element.

4. The semiconductor device according to claim 1,
   wherein the second conductive layer is electrically connected to a pixel electrode being electrically connected to one of a source and a drain of the transistor, and
   wherein the semiconductor device is configured to set a potential of the first conductive layer higher than a potential of the pixel electrode when being driven.

5. A display device comprising the semiconductor device according to claim 1.

6. An electronic device comprising the semiconductor device according to claim 1.

7. A semiconductor device comprising:
   a transistor comprising:
   a gate electrode;
   a first semiconductor layer including a channel formation region, the first semiconductor layer containing oxygen, indium, zinc and a metal other than indium and zinc; and
   an insulating layer between the gate electrode and the first semiconductor layer; and
   a capacitor comprising:
   a first conductive layer;
   the insulating layer over the first conductive layer; and
   a second conductive layer over the insulating layer, the second conductive layer containing oxygen, indium, zinc and the metal,
   wherein each of the first semiconductor layer, the first conductive layer, the insulating layer and the second conductive layer is capable of transmitting light, wherein the second conductive layer is a semiconductor layer being over and in contact with a same surface as the first semiconductor layer, and wherein the second conductive layer includes a region having a higher conductivity than the channel formation region of the first semiconductor layer.

8. The semiconductor device according to claim 7, wherein the first conductive layer includes an oxide semiconductor.

9. The semiconductor device according to claim 7, wherein the first conductive layer contains one or more elements selected from boron, nitrogen, fluorine, aluminum, phosphorus, arsenic, indium, tin, antimony, and a rare gas element.

10. The semiconductor device according to claim 7,
wherein the second conductive layer is electrically connected to a pixel electrode being electrically connected to one of a source and a drain of the transistor, and wherein the semiconductor device is configured to set a potential of the first conductive layer higher than a potential of the pixel electrode when being driven.

11. A display device comprising the semiconductor device according to claim 7.

12. An electronic device comprising the semiconductor device according to claim 7.

13. A semiconductor device comprising:
a transistor comprising:
a gate electrode;
a first semiconductor layer including a channel formation region, the first semiconductor layer containing oxygen, indium, zinc and a metal other than indium and zinc; and
an insulating layer between the gate electrode and the first semiconductor layer; and
a capacitor comprising:
a first conductive layer;
a dielectric layer over the first conductive layer; and
a second conductive layer over the dielectric layer, the second conductive layer containing oxygen, indium, zinc and the metal,
wherein each of the first semiconductor layer, the first conductive layer, the dielectric layer and the second conductive layer is capable of transmitting light,
wherein the second conductive layer is a semiconductor layer being over and in contact with a same surface as the first semiconductor layer,
wherein the dielectric layer has a stacked-layer structure of a nitride insulating layer and an oxide insulating layer,
wherein the second conductive layer is in contact with the nitride insulating layer, and
wherein the second conductive layer includes a region having a higher conductivity than the channel formation region of the first semiconductor layer.

14. The semiconductor device according to claim 13, wherein the first conductive layer includes an oxide semiconductor.

15. The semiconductor device according to claim 13, wherein the first conductive layer contains one or more elements selected from boron, nitrogen, fluorine, aluminum, phosphorus, arsenic, indium, tin, antimony, and a rare gas element.

16. The semiconductor device according to claim 13,
wherein the second conductive layer is electrically connected to a pixel electrode being electrically connected to one of a source and a drain of the transistor, and wherein the semiconductor device is configured to set a potential of the first conductive layer higher than a potential of the pixel electrode when being driven.

17. A display device comprising the semiconductor device according to claim 13.

18. An electronic device comprising the semiconductor device according to claim 13.

19. The semiconductor device according to claim 1, wherein the semiconductor layer and the second conductive layer are formed from a same layer.

20. The semiconductor device according to claim 7, wherein the first semiconductor layer and the second conductive layer are formed from a same layer.

21. The semiconductor device according to claim 13, wherein the first semiconductor layer and the second conductive layer are formed from a same layer.

22. The semiconductor device according to claim 1, comprising a first insulating layer in contact with the second conductive layer, the first insulating layer containing nitrogen.

23. The semiconductor device according to claim 7, comprising a first insulating layer in contact with the second conductive layer, the first insulating layer containing nitrogen.

24. The semiconductor device according to claim 1, comprising:
a first insulating layer over and in contact with the semiconductor layer and the second conductive layer, the first insulating layer containing oxygen; and
a second insulating layer over and in contact with the first insulating layer, the second insulating layer containing nitrogen,
wherein oxygen content in the first insulating layer is higher than that in the stoichiometric composition.

25. The semiconductor device according to claim 7, comprising:
a first insulating layer over and in contact with the first semiconductor layer and the second conductive layer, the first insulating layer containing oxygen; and
a second insulating layer over and in contact with the first insulating layer, the second insulating layer containing nitrogen,
wherein oxygen content in the first insulating layer is higher than that in the stoichiometric composition.

26. The semiconductor device according to claim 13, comprising:
a first insulating layer over and in contact with the first semiconductor layer and the second conductive layer, the first insulating layer containing oxygen; and
a second insulating layer over and in contact with the first insulating layer, the second insulating layer containing nitrogen,
wherein oxygen content in the first insulating layer is higher than that in the stoichiometric composition.

* * * * *